United States Patent
Wheatley et al.

(10) Patent No.: US 7,497,608 B2
(45) Date of Patent: *Mar. 3, 2009

(54) PHOSPHOR BASED ILLUMINATION SYSTEM HAVING A LONG PASS REFLECTOR AND METHOD OF MAKING SAME

(75) Inventors: John A. Wheatley, Lake Elmo, MN (US); Andrew J. Ouderkirk, Woodbury, MN (US); Michael F. Weber, Shoreview, MN (US); Kenneth A. Epstein, St. Paul, MN (US); James E. Watson, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/838,524

(22) Filed: Aug. 14, 2007

(65) Prior Publication Data

US 2007/0274098 A1 Nov. 29, 2007

Related U.S. Application Data

(62) Division of application No. 10/884,720, filed on Jun. 30, 2004, now Pat. No. 7,255,469.

(51) Int. Cl.
*F21V 7/04* (2006.01)
(52) U.S. Cl. .................. 362/609; 362/560; 362/616
(58) Field of Classification Search ............. 362/560, 362/609, 616
See application file for complete search history.

(56) References Cited

U.S. PATENT DOCUMENTS

| | | |
|---|---|---|
| 3,711,176 A | 1/1973 | Alfrey, Jr. et al. |
| 4,822,144 A | 4/1989 | Vriens |
| 5,540,978 A | 7/1996 | Schrenk |
| 5,882,774 A | 3/1999 | Jonza et al. |
| 6,010,751 A | 1/2000 | Shaw et al. |
| 6,172,810 B1 | 1/2001 | Fleming et al. |
| 6,210,012 B1 | 4/2001 | Broer |
| 6,501,091 B1 | 12/2002 | Bawendi et al. |
| 6,531,230 B1 | 3/2003 | Weber et al. |
| 6,655,810 B2 | 12/2003 | Hayashi et al. |
| 6,802,613 B2 | 10/2004 | Agostinelli et al. |
| 6,827,460 B2 | 12/2004 | Higuchi |
| 6,930,737 B2 | 8/2005 | Weindorf et al. |

(Continued)

FOREIGN PATENT DOCUMENTS

EP 733 919 9/1996

(Continued)

*Primary Examiner*—Sandra O'Shea
*Assistant Examiner*—James W Cranson
(74) *Attorney, Agent, or Firm*—Jay R. Pralle

(57) ABSTRACT

An illumination system including a light source, a light guide including an output surface, emissive material positioned between the light source and the output surface of the light guide, and an interference reflector positioned between the emissive material and the output surface of the light guide is disclosed. The light source emits light having a first optical characteristic. The emissive material emits light having a second optical characteristic when illuminated with light having the first optical characteristic. The interference reflector substantially transmits light having the second optical characteristic and substantially reflects light having the first optical characteristic.

20 Claims, 11 Drawing Sheets

U.S. PATENT DOCUMENTS

| | | | |
|---|---|---|---|
| 6,950,155 B2 | 9/2005 | Umemoto | |
| 6,951,400 B2 | 10/2005 | Chisholm et al. | |
| 7,072,096 B2 | 7/2006 | Holman et al. | |
| 7,106,505 B2 | 9/2006 | Whitehead et al. | |
| 7,182,498 B2 | 2/2007 | Schultz et al. | |
| 7,193,248 B2 | 3/2007 | Weindorf et al. | |
| 7,204,630 B2 | 4/2007 | Schardt et al. | |
| 7,204,631 B2 | 4/2007 | Weber et al. | |
| 7,213,958 B2 * | 5/2007 | Ouderkirk et al. | 362/609 |
| 7,255,469 B2 | 8/2007 | Wheatley et al. | |
| 2001/0055208 A1 | 12/2001 | Kimura | |
| 2002/0054406 A1 | 5/2002 | Duerksen | |
| 2002/0071267 A1 | 6/2002 | Lekson et al. | |
| 2002/0084749 A1 | 7/2002 | Ayala et al. | |
| 2002/0154406 A1 | 10/2002 | Merrill et al. | |
| 2002/0180351 A1 | 12/2002 | McNulty et al. | |
| 2004/0004761 A1 | 1/2004 | Travis | |
| 2004/0095780 A1 | 5/2004 | Reed | |
| 2004/0105247 A1 | 6/2004 | Calvin et al. | |
| 2004/0112877 A1 | 6/2004 | Smithson et al. | |
| 2004/0116033 A1 | 6/2004 | Ouderkirk et al. | |
| 2004/0125457 A1 | 7/2004 | Umemoto et al. | |
| 2004/0145913 A1 | 7/2004 | Ouderkirk et al. | |
| 2004/0149998 A1 | 8/2004 | Henson et al. | |
| 2004/0150991 A1 | 8/2004 | Ouderkirk et al. | |
| 2004/0228107 A1 | 11/2004 | Lee et al. | |
| 2004/0232812 A1 | 11/2004 | Beeson et al. | |
| 2005/0069256 A1 | 3/2005 | Jennings et al. | |
| 2005/0073495 A1 | 4/2005 | Harbers et al. | |
| 2005/0116176 A1 | 6/2005 | Aguirre et al. | |
| 2005/0116235 A1 | 6/2005 | Schultz et al. | |
| 2005/0116635 A1 | 6/2005 | Walson et al. | |
| 2005/0117366 A1 | 6/2005 | Simbal | |
| 2005/0134527 A1 | 6/2005 | Ouderkirk et al. | |
| 2005/0140270 A1 | 6/2005 | Henson et al. | |
| 2005/0224826 A1 | 10/2005 | Kueper et al. | |
| 2005/0243570 A1 | 11/2005 | Chaves et al. | |
| 2005/0276073 A1 | 12/2005 | Mi et al. | |
| 2006/0001036 A1 | 1/2006 | Jacob et al. | |
| 2006/0002108 A1 | 1/2006 | Ouderkirk et al. | |

FOREIGN PATENT DOCUMENTS

| | | |
|---|---|---|
| WO | WO 97-01778 | 1/1997 |
| WO | WO 01-75490 | 10/2001 |
| WO | WO 2004-051705 | 6/2004 |
| WO | WO 2004-099664 | 11/2004 |

* cited by examiner

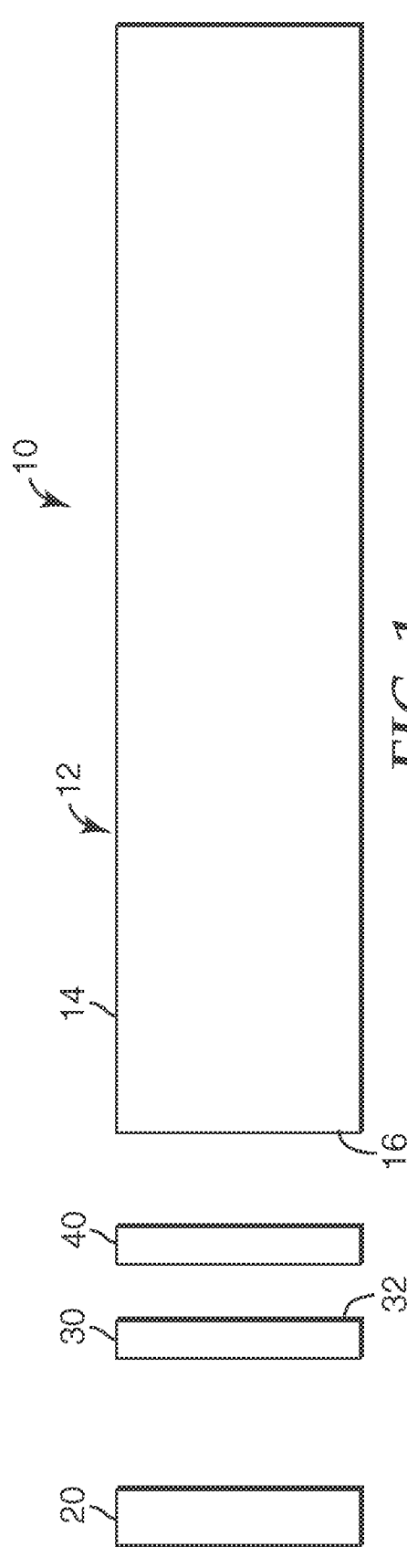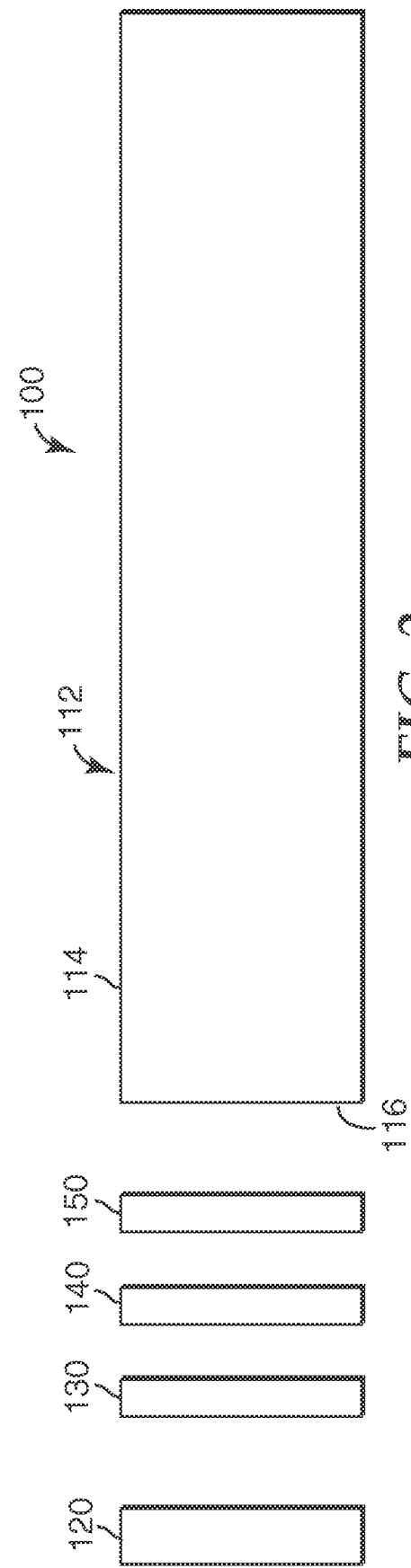

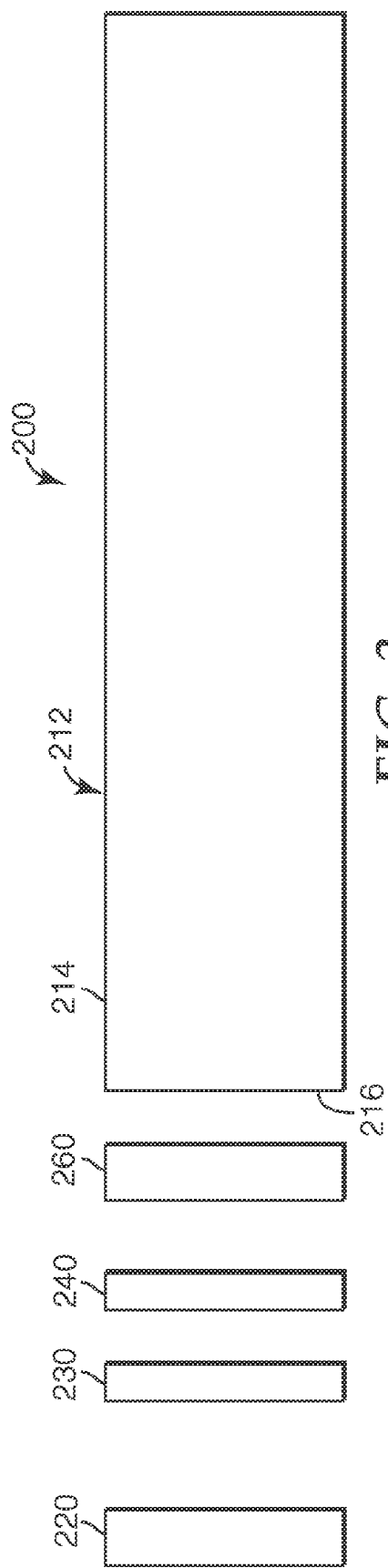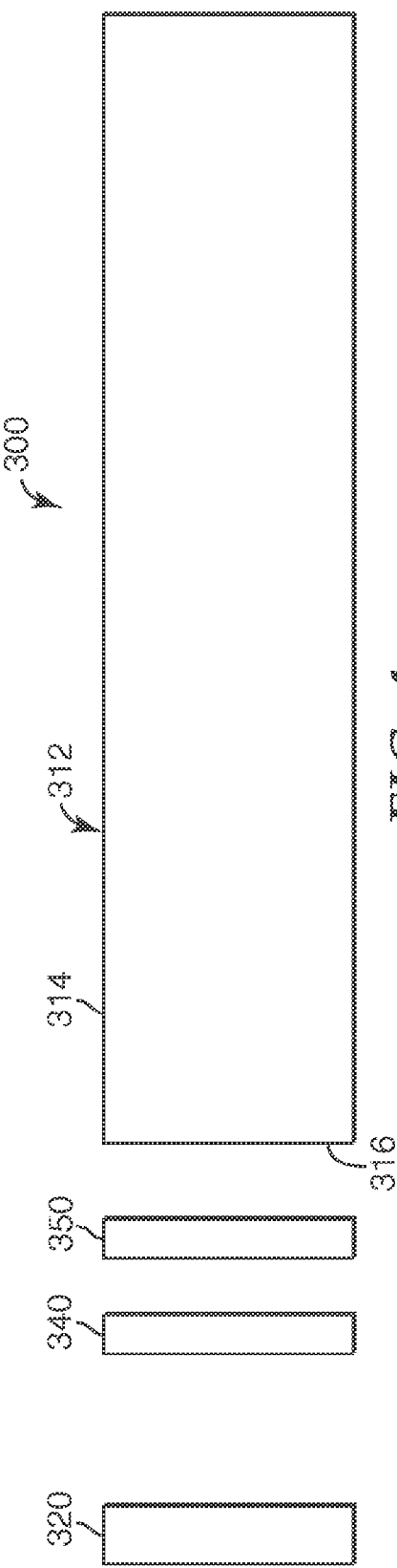

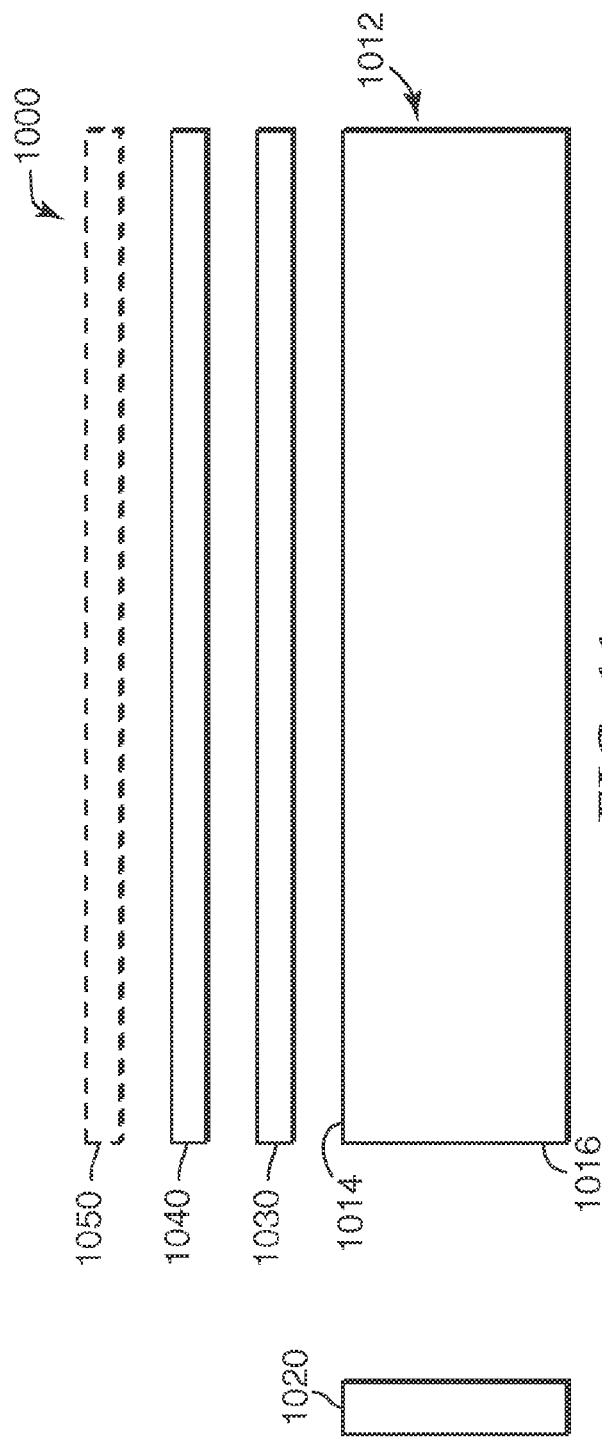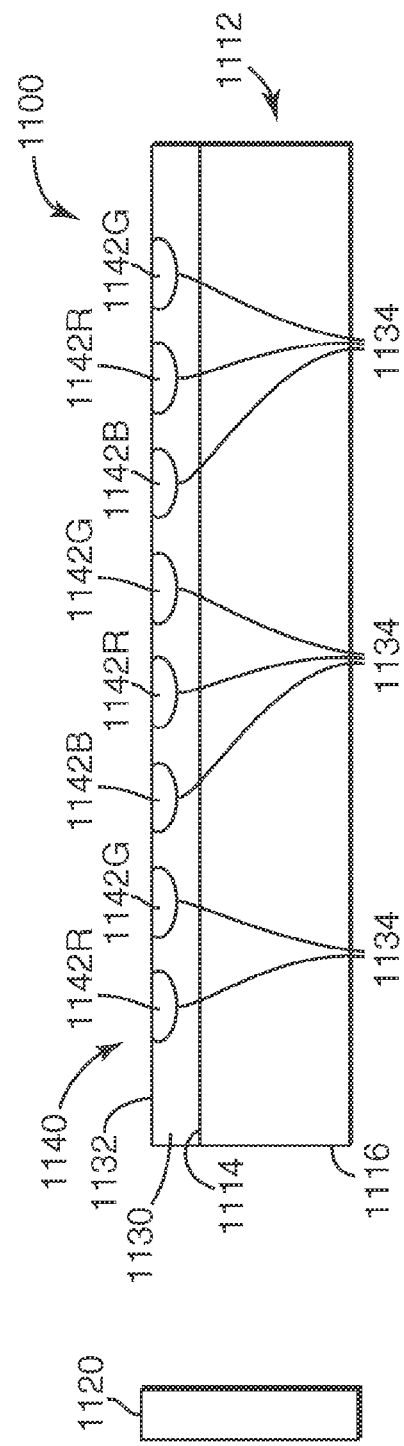

PHOSPHOR BASED ILLUMINATION SYSTEM HAVING A LONG PASS REFLECTOR AND METHOD OF MAKING SAME

RELATED PATENT APPLICATIONS

This application is a divisional of U.S. patent application Ser. No. 10/884,720 filed on Jun. 30, 2004 now U.S. Pat. No. 7,255,469.

The following co-owned U.S. patents and Patent Application Publications are incorporated herein by reference: U.S. 2006/0002108 (Ouderkirk et al.); U.S. Pat. No. 7,204,631 (Weber et al.); U.S. Pat. No. 7,204,630; U.S. Pat. No. 7,182,498 (Schultz et al.); U.S. Pat. No. 7,213,958 (Ouderkirk et al.).

BACKGROUND

White light sources that utilize light emitting diodes (LEDs) in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In another configuration, referred to herein as phosphor-converted LEDs (PCLEDs), a single LED generates light in a narrow range of wavelengths, which light impinges upon and excites a phosphor or other type of emissive material to produce light having different wavelengths than those generated by the LED. The phosphor can include a mixture or combination of distinct emissive materials, and the light emitted by the phosphor can include broad or narrow emission lines distributed over the visible wavelength range such that the emitted light appears substantially white to the unaided human eye.

An example of a PCLED is a blue LED illuminating a phosphor that converts blue light to longer wavelengths. A portion of the blue excitation light is not absorbed by the phosphor, and the residual blue excitation light is combined with longer wavelengths emitted by the phosphor. Another example of a PCLED is an ultraviolet (UV) LED illuminating a phosphor that absorbs and converts UV light either to red, green, and blue light, or a combination of blue and yellow light.

Another application of PCLEDs is to convert UV or blue light to green light. In general, green LEDs have a relatively low efficiency and can change output wavelength during operation. In contrast to green LEDs, green PCLEDs, can have improved wavelength stability.

Advantages of white light PCLEDs over direct emission white LEDs include better color stability as a function of device aging and temperature, and better batch-to-batch and device-to-device color uniformity/repeatability. However, PCLEDs can be less efficient than direct emission LEDs, due in part to inefficiencies in the process of light absorption and re-emission by the phosphor.

SUMMARY

The present disclosure provides illumination systems that utilize emissive materials and interference reflectors for filtering components. In some embodiments, the interference reflectors of the present disclosure may include multilayer optical films including individual optical layers, at least some of which are birefringent, arranged into optical repeat units through the thickness of the film. Adjacent optical layers have refractive index relationships that maintain reflectivity and avoid leakage of p-polarized light at moderate to high incidence angles.

In one aspect, the present disclosure provides an illumination system, including a light source that emits light having a first optical characteristic, and a light guide including an output surface. The illumination system also includes emissive material positioned between the light source and the output surface of the light guide, where the emissive material emits light having a second optical characteristic when illuminated with light having the first optical characteristic. The system further includes an interference reflector positioned between the emissive material and the output surface of the light guide, where the interference reflector substantially transmits light having the second optical characteristic and substantially reflects light having the first optical characteristic.

In another aspect, the present disclosure provides a method of manufacturing an illumination system, including providing a light source that emits light having a first optical characteristic; and positioning emissive material to receive light emitted by the light source, where the emissive material emits light having a second optical characteristic when illuminated with light having the first optical characteristic. The method further includes positioning an interference reflector such that the emissive material is between the light source and the interference reflector, where the interference reflector substantially transmits light having the second optical characteristic and substantially reflects light having the first optical characteristic. The method further includes positioning a light guide to receive light transmitted by the interference reflector, where the light guide directs at least a portion of light transmitted by the interference reflector through an output surface of the light guide.

In another aspect, the present disclosure provides a display, including an illumination system and a spatial light modulator. The illumination system includes a light source that emits light having a first optical characteristic, and a light guide including an output surface. The illumination system further includes an interference reflector positioned between the light source and the output surface of the light guide, where the interference reflector substantially transmits light having a second optical characteristic and substantially reflects light having the first optical characteristic. The illumination system further includes emissive material positioned between the light source and the interference reflector, wherein the emissive material emits light having the second optical characteristic when illuminated light having the first optical characteristic. The spatial light modulator is optically coupled to the illumination system and includes a plurality of controllable elements operable to modulate at least a portion of light from the illumination system.

In another aspect, the present disclosure provides a method of providing illumination to a desired location, including illuminating emissive material with light having a first optical characteristic, where the emissive material emits light having a second optical characteristic when illuminated with light having the first optical characteristic. The method further includes illuminating an interference reflector with light emitted by the emissive material, where the interference reflector substantially transmits light having the second optical characteristic and substantially reflects light having the first optical characteristic; and directing at least a portion of the light transmitted by the interference reflector to the desired location.

The above summary of the present disclosure is not intended to describe each disclosed embodiment or every

BRIEF DESCRIPTION OF THE DRAWINGS

FIG. 1 schematically illustrates one embodiment of an illumination system having a short pass interference reflector.

FIG. 2 schematically illustrates one embodiment of an illumination system having a short pass interference reflector and a long pass interference reflector.

FIG. 3 schematically illustrates one embodiment of an illumination system having a short pass interference reflector and one or more optical elements.

FIG. 4 schematically illustrates one embodiment of an illumination system having a long pass interference reflector.

FIG. 11 schematically illustrates an embodiment of an illumination system having a short pass interference reflector positioned between emissive material and an output surface of a light guide.

FIG. 12 schematically illustrates an embodiment of an illumination system having a short pass interference reflector positioned adjacent an output surface of a light guide and one or more phosphor dots positioned on the short pass interference reflector.

DETAILED DESCRIPTION

Figure 5:
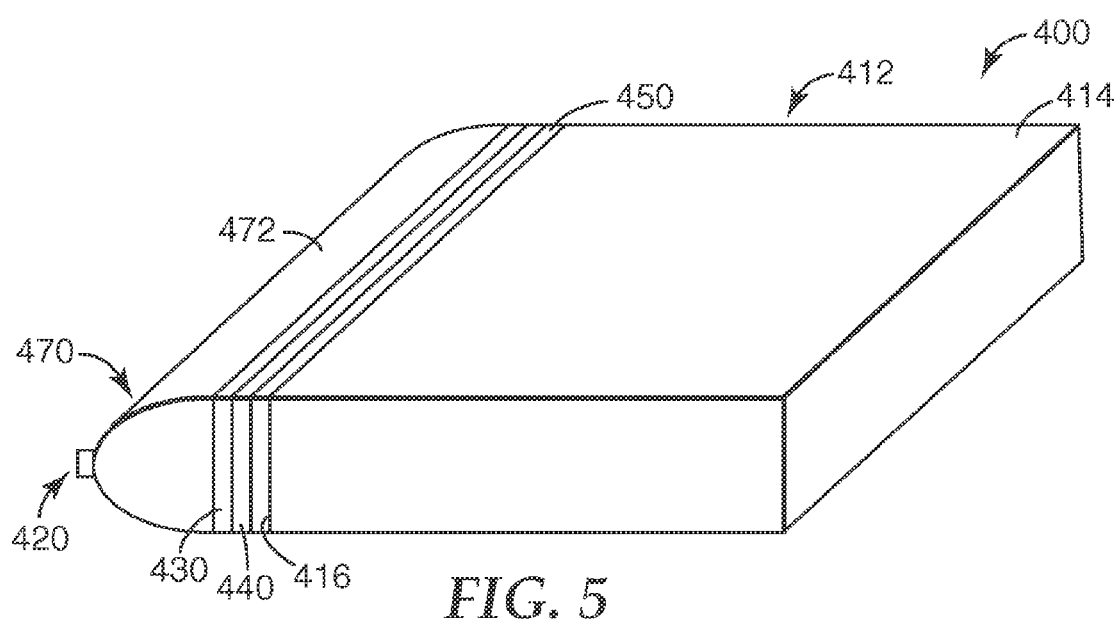
FIG. 5 schematically illustrates one embodiment of an illumination system having a short pass interference reflector, a long pass interference reflector, and an optical cavity.

The present disclosure provides illumination systems that include a light source, one or more light guides, emissive material, and one or more interference reflectors. In some embodiments, the illumination systems provide white light for various applications. As used herein, the term "white light" refers to light that stimulates red, green, and blue sensors in the human eye to yield an appearance that an ordinary observer would consider "white." Such light may be biased to the red (commonly referred to as warm white light) or to the blue (commonly referred to as cool white light). Further, such light can have a color rendering index of up to 100.

In general, these illumination systems include a light source that emits light including a first optical characteristic. The systems of the present disclosure also include emissive material that emits light having a second optical characteristic when illuminated with light having the first optical characteristic. The first optical characteristic and second optical characteristic may be any suitable optical characteristic, e.g., wavelength, polarization, modulation, intensity, etc. For example, the first optical characteristic may include a first wavelength region, and the second optical characteristic may include a second wavelength region that is different than the first wavelength region. In one exemplary embodiment, the light source may emit light having a first optical characteristic, where the first optical characteristic includes a first wavelength region including UV light. In this illustrative embodiment, the UV light emitted by the light source illuminates emissive material, which cause such material to emit light having a second optical characteristic, where the second optical characteristic includes a second wavelength region including visible light.

Some embodiments of the present disclosure include a short pass (SP) interference reflector. As used herein, the term "short pass interference reflector" refers to a reflector that substantially transmits light having a first optical characteristic and substantially reflects light having a second optical characteristic. In one exemplary embodiment, an illumination system includes a SP interference reflector that substantially transmits UV light from a light source and substantially reflects visible light emitted by emissive material that has been illuminated by the transmitted UV light.

Further, in some embodiments, the illumination systems include a long pass (LP) interference reflector. As used herein, the term "long pass interference reflector" refers to a reflector that substantially transmits light having a second optical characteristic and substantially reflects light having a first optical characteristic. For example, in one exemplary embodiment, an illumination system includes a LP interference reflector that substantially transmits visible light emitted by emissive material and substantially reflects UV light from a light source that had illuminated the emissive material.

In general, when the first optical characteristic and second optical characteristic are associated with wavelength, the emissive materials of the present disclosure may down-convert shorter wavelength light (e.g., UV light) to longer wavelength light (e.g., visible light). Alternatively, it is also possible to up-convert infrared radiation to visible light. For example, up-converting phosphors are well known in the art and typically use two or more infrared photons to generate 1 visible photon. Infrared LEDs needed to excite such phosphors have also been demonstrated and are very efficient. Visible light sources that use this process can be made more efficient with the addition of LP interference reflectors and/or SP interference reflectors, although the functions of each are reversed in this case compared to the down-converting phosphor systems. A SP interference reflector can be used to direct IR light towards the phosphor while transmitting the visible light, and an LP interference reflector can be placed such that the phosphor is between the LED and the LP interference reflector, where the LP interference reflector directs emitted visible light outward towards the intended system or user.

Although the exemplary embodiments of the present disclosure generally associate the first optical characteristic and second optical characteristic with wavelength, it is understood that such exemplary embodiments can also associate the first optical characteristic and second optical characteristic with other suitable characteristics of light, e.g., polarization, modulation, intensity, etc. For example, a SP interference reflector may be selected such that it substantially transmits light of a first polarization while the LP interference reflector substantially transmits light of a second polarization.

The illumination systems of the present disclosure may be used in any suitable application. For example, in some embodiments, an illumination system may be used as a light source for displays, light fixtures, headlamps, signs, etc.

In some embodiments, one or both of the SP interference reflector and LP interference reflector include polymeric multilayer optical films. Polymeric multilayer optical films are films that have tens, hundreds, or thousands of alternating layers of at least a first and second polymer material. Such layers have thicknesses and refractive indices that are selected to achieve a desired reflectivity in a desired portion of the spectrum, such as a reflection band limited to UV wavelengths or a reflection band limited to visible wavelengths. See, e.g., U.S. Pat. No. 5,882,774 (Jonza et al.). The polymeric multilayer optical films can be processed so that adjacent layer pairs have matching or near-matching, or deliberately mismatched refractive indices associated with a z-axis normal to the film such that the reflectivity of each interface between adjacent layers, for p-polarized light, decreases slowly with angle of incidence, is substantially independent of angle of incidence, or increases with angle of incidence away from the normal. Hence, such polymeric multilayer optical films can maintain high reflectivity levels for p-polarized light even at highly oblique incidence angles, thereby reducing the amount of p-polarized light transmitted by the reflective films compared to conventional inorganic isotropic stack reflectors. In some embodiments, the polymeric materials and processing conditions are selected so that, for each pair of adjacent optical layers, the difference in refractive index along the z-axis (parallel to the thickness of the film) is no more than a fraction of the refractive index difference along the x- or y- (in-plane) axes, the fraction being 0.5, 0.25, or even 0.1. The refractive index difference along the z-axis can be of the same or opposite sign as the in-plane refractive index differences.

Such polymeric multilayer optical films can be formed into any suitable shape as is further described herein. For example, polymeric multilayer optical film can be permanently deformed by embossing, thermoforming, or other known techniques to have a 3-dimensional shape such as a portion of a paraboloid, a sphere, or an ellipsoid. See, e.g., U.S. Patent Application Publication No. 2002/0154406 (Merrill et al.). See also U.S. Pat. No. 5,540,978 (Schrenk).

A wide variety of polymer materials are suitable for use in multilayer optical films for illumination systems. In certain applications according to various embodiments of the disclosure, it is desirable that the multilayer optical film includes alternating polymer layers composed of materials that resist degradation when exposed to UV light, e.g., a polymer pair of polyethylene terephthalate (PET)/co-polymethylmethacrylate (co-PMMA). The UV stability of polymeric reflectors can also be increased by the incorporation of non-UV absorbing light stabilizers such as hindered amine light stabilizers (HALS). In some cases, the polymeric multilayer optical film can also include transparent metal or metal oxide layers. See, e.g., PCT Publication WO 97/01778 (Ouderkirk et al.). In applications that use particularly high intensity UV light that would unacceptably degrade even robust polymer material combinations, it may be beneficial to use inorganic materials to form the multilayer optical films. The inorganic material layers can be isotropic or can be made to exhibit form birefringence as described, e.g., in PCT Publication WO 01/75490 (Weber) and thus have the beneficial refractive index relationships that yield enhanced p-polarization reflectivity as described herein.

In general, the interference reflectors described herein include reflectors that are formed of organic, inorganic, or a combination of organic and inorganic materials. The interference reflector can be a multilayer interference reflector. The interference reflector can be a flexible interference reflector. A flexible interference reflector can be formed from polymeric, non-polymeric materials, or polymeric and non-polymeric materials. Exemplary films including a polymeric and non-polymeric material are disclosed in U.S. Pat. No. 6,010,751 (Shaw et al.); U.S. Pat. No. 6,172,810 (Fleming et al.); and EP 733,919A2 (Shaw et al.).

The interference reflectors described herein can be formed from flexible, plastic, or deformable materials and can itself be flexible, plastic, or deformable. These flexible interference reflectors can be deflected or curved and still retain their pre-deflection optical properties.

Known self-assembled periodic structures, such as cholesteric reflecting polarizers and certain block copolymers, are considered to be multilayer interference reflectors for purposes of this disclosure. Cholesteric mirrors can be made using a combination of left and right handed chiral pitch elements.

In some embodiments of the present disclosure, the interference reflectors can be selected to substantially transmit or partially transmit light having a selected optical characteristic.

For example, a LP interference reflector that partially transmits blue light can be used in combination with a thin yellow phosphor layer in order to direct some blue light from a light source back onto the phosphor layer after the first pass through the phosphor.

In addition to providing reflection of blue light and UV light, a function of the multilayer optical film can be to block transmission of UV light so as to prevent degradation of subsequent elements inside or outside the illumination system, including prevention of human eye damage. In some embodiments, a UV absorber may be included on the side of the UV reflector furthest away from the light source. This UV absorber can be in, on, or adjacent to the multilayer optical film.

Although the interference reflectors of the present disclosure may include any suitable material or materials, an all polymer construction can offer several manufacturing and cost benefits. If high temperature polymers with high optical transmission and large index differentials are utilized in the interference reflectors, then an environmentally stable reflector that is both thin and very flexible can be manufactured to meet the optical needs of SP and LP interference reflectors. In some embodiments, coextruded multilayer interference reflectors as taught, e.g., in U.S. Pat. No. 6,531,230 (Weber et al.), can provide precise wavelength selection as well as large area, cost effective manufacturing. The use of polymer pairs having high index differentials allows the construction of very thin, highly reflective mirrors that are freestanding, i.e., have no substrate but are still easily processed. Alternatively, the interference reflectors of the present disclosure may be formed by casting as is described, e.g., in U.S. Pat. No. 3,711,176 (Alfrey, Jr. et al.).

An all polymeric interference reflector can be thermoformed into various three-dimensional shapes, e.g., hemispherical domes (as is further described herein). However, care must be taken to control the thinning to the correct amount over the entire surface of the dome to create the desired angular performance. Interference reflectors having a simple two-dimensional curvature are easier to create than three-dimensional, compound shaped interference reflectors. In particular, any thin and flexible interference reflector can be bent into a two-dimensional shape, e.g., a part of a cylinder, in this case an all polymeric interference reflector is not needed. Multilayer inorganic interference reflectors on thin polymeric substrates can be shaped in this manner, as well as inorganic multilayers on glass substrates that are less than 200 μm in thickness. The latter may have to be heated to temperatures near the glass transition point to obtain a permanent shape with low stress.

Optimum bandedges for SP and LP interference reflectors will depend on the emission spectra of both the light source and the emissive material in the system. In an illustrative embodiment, for a SP interference reflector, substantially all of the emission from the light source passes through the SP interference reflector to excite the emissive material, and substantially all of the emissions directed back toward the light source are reflected by the SP interference reflector so they do not enter the light source or its base structure where they could be absorbed. For this reason, the short pass defining bandedge of the SP interference reflector is placed in a region between the average emission wavelength of the light source and the average emission wavelength of the emissive material. In an illustrative embodiment, the SP interference reflector is placed between the light source and the emissive material. If, however, the SP interference reflector is planar, the emissions from a light source can strike the SP interference reflector at a variety of angles normal to a surface of the SP interference reflector, and at some angle of incidence be reflected by the SP interference reflector and fail to reach the emissive material. Unless the interference reflector is curved to maintain a nearly constant angle of incidence, one may desire to place the design bandedge at a wavelength larger than the midpoint of the emissive material and the light source emission curves to optimize the overall system performance. In particular, very little emissive material emission is directed to the interference reflector near zero degrees angle of incidence (i.e., normal to a surface of the interference reflector) because the included solid angle is very small.

In another illustrative embodiment, LP interference reflectors are placed opposite the emissive material from the light source to recycle the light source light back to the emissive material to improve system efficiency. In an illustrative embodiment, a LP interference reflector may be omitted if the light source emissions are in the visible spectrum and large amounts are needed to balance the color output of the emissive material. However, a LP interference reflector that partially transmits shorter wavelength light, e.g., blue light, can be used to optimize the angular performance of a blue-light source/yellow-phosphor system via the spectral angle shift that would pass more blue light at higher angles than at normal incidence.

In a further illustrative embodiment, the LP interference reflector is curved to maintain a nearly constant angle of incidence of the emitted light from the light source on the LP interference reflector. In this embodiment, the emissive material and the light source both face one side of the LP interference reflector. At high angles of incidence, a LP interference reflector having a substantially planar shape may not reflect shorter wavelength light. For this reason, the long wavelength bandedge of the LP interference reflector can be placed at as long a wavelength as possible while blocking as little of the emissive material emission as possible. Again, the bandedge placement can be changed to optimize the overall system efficiency.

In some embodiments, the multilayer interference reflectors described herein may have a lateral thickness gradient, i.e., a thickness that differs from one cross-section of the reflector to another cross-section of the reflector. These reflectors may have thicker interference layers as the emitted light angle of incidence increases toward an outer region of the multilayer reflector. Increasing the reflector thickness at the outer region of the reflector compensates for band shifting, since the reflected wavelength is proportional to the optical thickness of the high and low index interference layers and the incidence angle.

FIG. 1 schematically illustrates one embodiment of an illumination system 10. The system 10 includes a light source 20 and a light guide 12 having an output surface 14. In some embodiments, the light guide 12 can also include an input surface 16. The system 10 also includes a first interference reflector 30 positioned between the light source 20 and the output surface 14 of the light guide 12. Positioned between the first interference reflector 30 and the output surface 14 of the light guide 12 is emissive material 40.

The light source 20 can include any suitable light source or light sources, e.g., electroluminescent devices, cold cathode fluorescent lights, electrodeless fluorescent lamps, LEDs, organic electroluminescent devices (OLEDs), polymer LEDs, laser diodes, arc lamps, etc. As used herein, the term "LED" refers to a diode that emits light, whether visible, ultraviolet, or infrared, whether coherent or incoherent. The term as used herein also includes incoherent epoxy-encased semiconductor devices marketed as "LEDs," whether of the conventional or super-radiant variety. The term as used herein also includes semiconductor laser diodes.

In some embodiments, the light source 20 can be positioned adjacent one or more sides of the light guide 12, and/or one or more major surfaces of the light guide 12. As illustrated in FIG. 1, the light source 20 is positioned adjacent the input surface 16. Although FIG. 1 illustrates illumination system 10 as having one light source 20, illumination system 10 may include two or more light sources positioned adjacent the same or other input surfaces of the light guide 12.

The light source 20 emits light having a first optical characteristic. Any suitable optical characteristic may be selected.

In some embodiments, the first optical characteristic can include a first wavelength region. For example, the light source 20 may emit UV light. As used herein, the term "UV light" refers to light having a wavelength in a range from about 150 nm to about 425 nm. In another example, the light source 20 may emit blue light.

In some embodiments, the light source 20 includes one or more LEDs. For example, the one or more LEDs can emit UV light and/or blue light. Blue light also includes violet and indigo light. LEDs include spontaneous emission devices as well as devices using stimulated or super radiant emission, including laser diodes and vertical cavity surface emitting laser diodes.

The light guide 12 of system 10 may include any suitable light guide, e.g., hollow or solid light guide. Although the light guide 12 is illustrated as being planar in shape, the light guide 12 may take any suitable shape, e.g., wedge, cylindrical, planar, conical, complex molded shapes, etc. Further, the input surface 16 and/or the output surface 14 of the light guide 12 may include any suitable shapes, e.g., those described above for the shape of the light guide 12. It may be preferred that the light guide 12 is configured to direct light through its output surface 14. Further, the light guide 12 may include any suitable material or materials. For example, the light guide 12 may include glass; acrylates, including polymethylmethacrylate, polystyrene, fluoropolymers; polyesters including polyethylene terephthalate (PET), polyethylene naphthalate (PEN), and copolymers containing PET or PEN or both; polyolefins including polyethylene, polypropylene, polynorborene, polyolefins in isotactic, atactic, and syndiotactic sterioisomers, and polyolefins produced by metallocene polymerization. Other suitable polymers include polyetheretherketones and polyetherimides.

The illumination system 10 also includes a first interference reflector 30 positioned between the light source 20 and the output surface 14 of the light guide 12. In the embodiment illustrated in FIG. 1, the first interference reflector 30 is a SP interference reflector, i.e., it substantially transmits light having the first optical characteristic from the light source 20 and substantially reflects light having a second optical characteristic. For example, as is further described herein, the emissive material 40 may emit visible light when illuminated with UV or blue light from the light source 20. In such an embodiment, the first interference reflector 30 may be selected such that it substantially transmits UV light and substantially reflects visible light. In other embodiments, the emissive material 40 may emit infrared light when illuminated with light from the light source 20. In such embodiments, the first interference reflector 30 may be selected such that it substantially transmits light from the light source 20 and substantially reflects infrared light.

The first interference reflector 30 may be positioned in any suitable location between the light source 20 and the output surface 14 of the light guide 12. In some embodiments, the first interference reflector 30 may be positioned on the input surface 16 of the light guide 12, within the light guide 12, or on the light source 20.

The first interference reflector 30 may include any suitable interference reflector or reflectors described herein. Further, the first interference reflector 30 may take any suitable shape, e.g., hemispherical, cylindrical, planar, etc.

The first interference reflector 30 can be formed of a material that resists degradation when exposed to UV, blue, or violet light, such as discussed herein. In general, the multilayer reflectors discussed herein can be stable under high intensity illumination for extended periods of time. High intensity illumination can be generally defined as a flux level from 1 to 100 Watt/cm$^2$. Suitable illustrative polymeric materials can include UV resistant material formed from, for example, acrylic material, PET material, PMMA material, polystyrene material, polycarbonate material, THV material available from 3M Company (St. Paul, Minn.), and combinations thereof. These materials and PEN material can be used with light sources that emit blue light.

The illumination system 10 also includes emissive material 40 positioned between the first interference reflector 30 and the output surface 14 of the light guide 12. The emissive material 40 emits light having a second optical characteristic when illuminated with light having the first optical characteristic from the light source 20. The second optical characteristic may be any suitable optical characteristic, e.g., wavelength, polarization, modulation, intensity, etc. In some embodiments, the light emitted by the emissive material 40 may include a second wavelength region when the emissive material 40 is illuminated with light emitted by the light source 20 that includes a first wavelength region. For example, in some embodiments, the emissive material 40 may emit visible light when illuminated with UV or blue light form the light source 20. As used herein, the term "visible light" refers to light that is perceptible to the unaided eye, e.g., generally in a wavelength range of about 400 nm to about 780 nm. In other embodiments, the emissive material 40 may emit visible light and/or infrared light. As used herein, the term "infrared light" refers to light in a wavelength range of 780 nm to 2500 nm.

In general, the embodiments disclosed herein are operative with a variety of emissive materials. In some embodiments, suitable phosphor materials may be used. Such phosphor materials are typically inorganic in composition, having excitation wavelengths in the 150-1100 nm range. A phosphor blend can comprise phosphor particles in the 1-25 μm size range dispersed in a binder such as silicone, fluoropolymer, epoxy, adhesive, or another polymeric matrix, which can then be applied to a substrate, such as an LED or a film. Phosphors include rare-earth doped garnets, silicates, and other ceramics. In other embodiments, the emissive materials can also include organic fluorescent materials, including fluorescent dyes and pigments, sulfides, aluminates, phosphates, nitrides. See, e.g., Shionoya et al., *Phosphor Handbook*, CRC Press, Boca Raton, Fla. (1998).

In embodiments that utilize emissive materials 40 having a narrow emission wavelength range, a mixture of emissive materials can be formulated to achieve the desired color balance, as perceived by the viewer, for example a mixture of red-, green- and blue-emitting materials. In other embodiments, emissive materials having broader emission bands can be useful for mixtures having higher color rendering indices. In some embodiments, the emissive materials can have fast radiative decay rates.

The emissive material 40 can be formed in a continuous or discontinuous layer. The emissive material 40 can be a uniform or non-uniform pattern. The emissive material 40 can include regions having a small area, e.g., "dots," each having an area in plan view of less than 10000 μm$^2$. In an illustrative embodiment, the dots can each be formed from a phosphor that emits longer wavelength light having one or more different peak wavelengths. For example, at least one dot can include a first emissive material that emits a peak wavelength in the red region, and at least another phosphor dot can include a second emissive material that emits a peak wavelength in the blue region. The dots emitting visible light having a plurality of peak wavelengths can be arranged and configured in any uniform or non-uniform manner as desired. For example, the emissive material 40 can include dots in a pattern having a non-uniform density gradient along a surface or an area. The dots can have any regular or irregular shape and need not be round in plan view. In addition, emissive material 40 can be in a co-extruded skin layer of a multilayer optical film.

Structured emissive materials can be configured in several ways to provide benefits in performance as described herein. When multiple phosphor types are used to provide broader or fuller spectral output, light from shorter wavelength phosphors can be re-absorbed by other phosphors. Patterns including isolated dots, lines, or isolated regions of each phosphor type can reduce the amount of re-absorption.

Multilayer emissive material structures can also reduce absorption. For example, layers of each emissive material may be formed in sequence, with the longest wavelength emitter nearest the excitation source. Light emitted nearer the emitter will, on average, undergo multiple scattering within the total emissive material to a greater extent than light emitted near the output surface of the emissive material. Since the shortest wavelength emitted is most prone to both scattering and re-absorption, it may be preferred to locate the shortest wavelength emissive material nearest the output surface of the emissive material. In addition, it may be preferred to use different thicknesses for each layer to compensate for the progressively lower intensity of the excitation light as it propagates through the multilayer structure. For emissive materials with similar absorption and emission efficiency, progressively thinner layers from excitation to output side would provide compensation for the decreasing excitation intensity in each layer. In some embodiments, one or more SP interference reflectors may be positioned between the different emissive material layers to reduce the emitted phosphor light that is scattered backward and re-absorbed by layers earlier in the sequence.

Non-scattering emissive materials can provide enhanced light output in combination with multilayer optical films. For example, non-scattering phosphor layers can include conventional phosphors in an index-matched binder (e.g., a binder with high index inert nanoparticles), nanosize particles of conventional phosphor compositions (e.g., where particle sizes are small and negligibly scatter light), or quantum dot emissive materials. Quantum dot emissive materials are light emitters based on semiconductors having low band gaps, e.g., cadmium sulfide, cadmium selenide or silicon, where the particles are sufficiently small so that the electronic structure is influenced and controlled by the particle size. Hence, the absorption and emission spectra are controlled via the particle size. See, e.g., U.S. Pat. No. 6,501,091 (Bawendi et al.).

The emissive material 40 may be positioned in any suitable location between the first interference reflector 30 and the output surface 14 of the light guide 12. In some embodiments, the emissive material 40 may be positioned on the input surface 16 of the light guide 12. Alternatively, the emissive material 40 may be placed within the light guide 12. In other embodiments, the emissive material 40 may be dispersed within the light guide 12. In other embodiments, the emissive material 40 may be positioned on an output surface 32 of the first interference reflector 30. Any suitable technique may be used to position the emissive material 40 on the first interference reflector 30, e.g., those techniques described in co-owned U.S. Pat. No. 7,118,438 (Ouderkirk et al.). For example, the emissive material 40 can be disposed or coated on the first interference reflector 30. The emissive material 40 can be laminated, as a solid layer, adjacent the first interference reflector 30. In addition, the emissive material 40 and the first interference reflector 30 can be thermoformed sequentially or simultaneously. The emissive material 40 can be compressible, elastomeric, and can even be contained in a foamed structure.

In some embodiments, the system 10 can also include a TIR promoting layer positioned on the emissive material 40 between the emissive material 40 and the first interference reflector 30. The TIR promoting layer may include any suitable material or materials that provide a refractive index that is lower than the refractive index of the binder in the emissive material 40. The TIR promoting layer may, in some embodiments, be an air gap. Such an air gap enables total internal reflection of light traversing at high incidence angles in the emissive material 40. In other embodiments, the TIR promoting layer may be a microstructured layer having a microstructured surface. The microstructured surface can be characterized by a single set of linear v-shaped grooves or prisms, multiple intersecting sets of v-shaped grooves that define arrays of tiny pyramids, one or more sets of narrow ridges, and so forth. When the microstructured surface of such a film is placed against another flat film, air gaps are formed between the uppermost portions of the microstructured surface and the flat film.

Certain types of emissive materials can produce heat, for example, when converting light from a first wavelength region to a second wavelength. The presence of an air gap near the emissive material 40 may significantly reduce heat transmission from the emissive material 40 to surrounding materials. The reduced heat transfer can be compensated for in other ways, such as by providing a layer of glass or transparent ceramic near the emissive material 40 that can remove heat laterally.

In general, the light source 20 emits light having a first optical characteristic, at least a portion of which illuminates the first interference reflector 30. In turn, the first interference reflector 30 substantially transmits the light from the light source 20. At least a portion of the transmitted light illuminates the emissive material 40. The emissive material 40 emits light having a second optical characteristic when illuminated with light having the first optical characteristic. Generally, the emissive material 40 may emit light in any direction. In other words, some light may be emitted back toward the light source 20, and some light may be emitted toward the light guide 12. Light emitted by the emissive material 40 that illuminates the first interference reflector 30 is substantially reflected such that the light does not reach the light source 20 where it can be absorbed. The light guide 12 directs at least a portion of the light emitted by the emissive material 40 through the output surface 14 where it can then be directed to a desired location using any suitable technique.

Some embodiments of illumination systems of the present disclosure may include more than one interference reflector. For example, FIG. 2 schematically illustrates one embodiment of an illumination system 100 that includes a light guide 112 having an output surface 114 and an input surface 116, and a light source 120. The system 100 also includes a first interference reflector 130 positioned between the light source 120 and the output surface 114 of the light guide 112, and emissive material 140 positioned between the first interference reflector 130 and the output surface 114. All of the design considerations and possibilities described herein with respect to the light guide 12, the light source 20, the first interference reflector 30, and the emissive material 40 of the embodiment illustrated in FIG. 1 apply equally to the light guide 112, the light source 120, the first interference reflector 130, and the emissive material 140 of the embodiment illustrated in FIG. 2.

One difference between the system 10 of FIG. 1 and the system 100 of FIG. 2 is that system 100 includes a second interference reflector 150 positioned such that the emissive material 140 is between the first interference reflector 130 and the second interference reflector 150. In some embodiments, the second interference reflector 150 is a LP interference reflector, i.e., a reflector that substantially transmits light having a second optical characteristic and substantially reflects light having a first optical characteristic. For example, in some embodiments, the emissive material 140 may emit visible light (i.e., the second optical characteristic) when illuminated with UV or blue light (i.e., the first optical characteristic). In such embodiments, the second interference reflector 150 may be selected such that it substantially transmits visible light and substantially reflects UV or blue light. In other embodiments, the emissive material 140 may emit infrared light when illuminated with UV or blue light. In these embodiments, the second interference reflector 150 may be selected such that it substantially transmits infrared light and substantially reflects UV or blue light.

The second interference reflector 150 may include any suitable interference reflector or reflectors described herein. Further, the second interference reflector 150 may take any suitable shape, e.g., hemispherical, cylindrical, or planar.

The second interference reflector 150 may be positioned in any suitable location between the emissive material 140 and the output surface 114 of the light guide 112. In some embodiments, the second interference reflector 150 may be positioned on the input surface 116 of the light guide 112. In other embodiments, the second interference reflector 150 may be positioned within the light guide 112. In some embodiments, the emissive material 140 may be positioned on the second interference reflector 150 as is further described, e.g., in co-owned and co-pending U.S. Patent Application Publication No. 2004/0145913 (Ouderkirk et al.). Alternatively, the first interference reflector 130, emissive material 140, and second interference reflector 150 may form an assembly where the emissive material 140 is in contact with both the first interference reflector 130 and the second interference reflector 150. Any suitable technique may be used to form such an assembly, e.g., those techniques as described in co-owned U.S. Pat. No. 7,118,438 (Ouderkirk et al.).

The presence of the first interference reflector 130 and second interference reflector 150 can enhance the efficiency of the illumination system 100. The second interference reflector 150 reflects at least a portion of the light that is not absorbed by the emissive material 140, and that would otherwise be wasted, back into the emissive material 140. This increases the effective path length of the light from the light source 120 through the emissive material 140, thereby increasing the amount of light absorbed by the emissive material 140 for a given thickness of the emissive material layer or layers. The recycling of the light from the light source 120 also allows use of thinner layers of emissive material 140 for efficient light conversion.

In general, at least a portion of light having a first optical characteristic emitted by the light source 120 illuminates the first interference reflector 130, which substantially transmits such light. At least a portion of light transmitted by the first interference reflector 130 illuminates the emissive material 140. When illuminated with light having the first optical characteristic, the emissive material 140 emits light having a second optical characteristic. At least a portion of the light emitted by the emissive material 140 illuminates the second interference reflector 150, which substantially transmits light having the second optical characteristic. At least a portion of the transmitted light enters the light guide 112 and is directed through the output surface 114 by the light guide 112. Any light from the light source 120 that illuminates the second interference reflector 150 is substantially reflected towards the emissive material 140 where it may excite the emissive material 140 causing further light emission. In addition, light emitted by the emissive material 140 that illuminates the first interference reflector 130 is substantially reflected back toward the second interference reflector 150 and/or the light guide 112.

The illumination systems of the present disclosure may include one or more optical elements. For example, FIG. 3 schematically illustrates an illumination system 200 that includes one or more optical elements 260. The system 200 further includes a light guide 212 having an output surface 214 and an input surface 216, and a light source 220. The system 200 also includes a first interference reflector 230 positioned between the light source 220 and the output surface 214 of the light guide 212, and emissive material 240 positioned between the first interference reflector 230 and the output surface 214 of the light guide 212. All of the design considerations and possibilities described herein with respect to the light guide 12, the light source 20, the first interference reflector 30, and the emissive material 40 of the embodiment illustrated in FIG. 1 apply equally to the light guide 212, the light source 220, the first interference reflector 230, and the emissive material 240 of the embodiment illustrated in FIG. 3. The system 200 may also include one or more additional interference reflectors (e.g., a LP interference reflector) as is further described herein.

The one or more optical elements 260 may be positioned between the emissive material 240 and the output surface 214 of the light guide 212, between the light source 220 and the first interference reflector 230, between the first interference reflector 230 and the emissive material 240 and/or adjacent the output surface 214 of the light guide 212. The one or more optical elements 260 can include any suitable optical element or elements, e.g., optical coupling agents such as adhesives or index matching fluids or gels, optical brightness enhancing films such as BEF (available from 3M Company), and short-wavelength absorbing materials such as ultraviolet light absorbing dyes and pigments, reflective polarizing films such as DBEF (also available from 3M Company), diffusers, and combinations thereof. In some embodiments, the one or more optical elements 260 are configured to control the angle of light emitted by the emissive material 240 that is directed into the light guide 212.

In some embodiments, the one or more optical elements 260 may include one or more reflective polarizers. In general, a reflective polarizer can be disposed adjacent the emissive material 240. The reflective polarizer allows light of a preferred polarization to be transmitted, while reflecting the other polarization. The emissive material 240 and other film components known in the art can depolarize the polarized light reflected by a reflective polarizer, and either by the reflection of the emissive material 240, or emissive material 240 in combination with the first interference reflector 230, light can be recycled and increase the polarized light brightness of the system 200. Suitable reflective polarizers include, for example, cholesteric reflective polarizers, cholesteric reflective polarizers with a ¼ wave retarder, wire grid polarizers, or a variety of reflective polarizers available from 3M Company, including DBEF (i.e., a specularly reflective polarizer), and DRPF (i.e., a diffusely reflective polarizer). The reflective polarizer preferably polarizes light over a substantial range of wavelengths and angles emitted by the emissive material 240, and in the case where the light source 220 emits blue light, may reflect the blue light as well.

Although the one or more optical elements 260 are illustrated in FIG. 3 as being outside of the light guide 212, the one or more optical elements 260 may be positioned on or inside the light guide 212. In some embodiments, the one or more optical elements 260 may be positioned on the emissive material 240. If a LP interference reflector is included in system 300 and positioned between the emissive material 240 and the output surface 214, then the one or more optical elements 260 may be positioned on the LP interference reflector.

In some embodiments, an illumination system may include a LP reflector without a SP reflector. For example, FIG. 4 schematically illustrates another embodiment of an illumination system 300. The system 300 includes a light guide 312 having an output surface 314 and an input surface 316, and a light source 320. The system 300 further includes emissive material 340 positioned between the light source 320 and the output surface 314 of the light guide, and an interference reflector 350 positioned between the emissive material 340 and the output surface 314 of the light guide 312. All of the design considerations and possibilities described herein with respect to the light guide 112, the light source 120, the emissive material 140, and the second interference reflector 150 of the embodiment illustrated in FIG. 2 apply equally to the light guide 312, the light source 320, the emissive material 340, and the interference reflector 350 of the embodiment illustrated in FIG. 4.

Although depicted as being positioned outside the light guide 312, the interference reflector 350 can be positioned in any suitable position between the emissive material 340 and the output surface 314 of the light guide 312. For example, the interference reflector 350 may be positioned on the input surface 316 of the light guide 312, or inside the light guide 312. In some embodiments, the interference reflector 350 is positioned on the emissive material 340.

Further, in some embodiments, system 300 may include one or more optical elements positioned between the light source 320 and the emissive material 340, between the emissive material 340 and the interference reflector 350, between the interference reflector 350 and the output surface 314 of the light guide 312, and/or adjacent the output surface 314 of the light guide 312 (e.g., one or more optical elements 360 of FIG. 3).

In general, the light source 320 emits light having a first optical characteristic, at least a portion of which illuminates the emissive material 340. When illuminated with light having the first optical characteristic, the emissive material 340 emits light having a second optical characteristic. At least a portion of the light emitted by the emissive material 340 illuminates the interference reflector 350. The interference reflector 350 substantially transmits light having the second optical characteristic and substantially reflects light having the first optical characteristic. At least a portion of the transmitted light is directed by the light guide 312 through the output surface 314 of the light guide 312. Any light emitted by the light source 320 that is not converted by the emissive material 340 is substantially reflected by the interference reflector 350 and directed back toward the emissive material 340 where it can be converted. Light directed through the output surface 314 can be directed to a desired location using any suitable technique.

Some light sources that may be utilized in the illumination systems of the present disclosure emit light in a broad emission cone. For example, some LEDs emit light in a hemispherical pattern having a solid angle of $2\pi$ steradians or greater. Some embodiments of the present disclosure provide non-imaging optical devices to collect and/or direct excitation light from the light source into the light guide.

For example, FIG. 5 is a schematic perspective view of one embodiment of an illumination system 400. The system 400 is similar to the illumination system 100 of FIG. 2. System 400 includes a light guide 412 having an output surface 414 and an input surface 416, and a light source 420. The system 400 also includes a first interference reflector 430 positioned between the light source 420 and the output surface 414 of the light guide 412, emissive material 440 positioned between the first interference reflector 430 and the output surface 414, and a second interference reflector 450 positioned between the emissive material 440 and the output surface 414. All of the design considerations and possibilities described herein with respect to the light guide 112, the light source 120, the first interference reflector 130, the emissive material 140, and the second interference reflector 150 of the embodiment illustrated in FIG. 2 apply equally to the light guide 412, the light source 420, the first interference reflector 430, the emissive material 440, and the second interference reflector 450 of the embodiment illustrated in FIG. 5.

One difference between the system 100 of FIG. 2 and the system 400 of FIG. 5 is that system 400 also includes an optical cavity 470 optically coupled to the light source 420, i.e., light from the light source 420 can be directed into the optical cavity 470. When two or more devices are optically coupled, such devices are in the same optical path and can direct light to each other using any suitable technique, e.g., reflection, transmission, emission, etc. The optical cavity 470 is configured to direct light emitted by the light source 420 toward the first interference reflector 430. The optical cavity 470 may be positioned in any suitable location. In some embodiments, the optical cavity 470 may be positioned in contact with the first interference reflector 430. In some embodiments, a TIR promoting layer or layers may be positioned between the optical cavity 470 and the first interference reflector 430 as is further described herein.

The optical cavity 470 may take any suitable shape, e.g., elliptical, wedge, rectangular, trapezoidal, etc. It may be preferred that the optical cavity 470 take a parabolic shape.

The optical cavity 470 may be made using any suitable material or materials. In some embodiments, the optical cavity 470 may include a broadband interference reflector 472. The broadband interference reflector 472 may be positioned on an optically clear body to form optical cavity 470. Such an optically clear body may be made of any suitable material or materials, e.g., glass; acrylates, including polymethylmethacrylate, polystyrene, fluoropolymers; polyesters including polyethylene terephthalate (PET), polyethylene naphthalate (PEN), and copolymers containing PET or PEN or both; polyolefins including polyethylene, polypropylene, polynorborene, polyolefins in isotactic, atactic, and syndiotactic sterioisomers, and polyolefins produced by metallocene polymerization. Other suitable polymers include polyetheretherketones and polyetherimides. In some embodiments, the broadband interference reflector 472 may be formed into the desired shape to form optical cavity 470. The broadband interference reflector 472 may be made using any suitable material or materials and using any suitable techniques, such as those materials and techniques described, e.g., in U.S. Pat. No. 5,882,774 (Jonza et al.).

In some embodiments, the optical cavity 470 may be solid. Alternatively, the optical cavity 470 may be filled with any suitable medium, e.g., gas, or liquid.

The optical cavity 470 is formed such that the light source 420 emits light into the optical cavity 470. Any suitable technique may be used such that light is directed into the optical cavity 470. For example, the light source 420 may be placed within the optical cavity 470. Alternatively, the light source 420 may be optically coupled to the optical cavity 470 via one or more openings or ports formed in the optical cavity 470.

In some embodiments, the optical cavity 470 may include one or more apertures (not shown) that allow light from the light source 420 to illuminate the first interference reflector 430. In one exemplary embodiment, the optical cavity 470 may include an elongated aperture that extends along at least a portion of the length of the optical cavity 470. The elongated aperture may be positioned adjacent the first interference reflector 430. In some embodiments, the optical cavity 470 may include diffusers or facets that may direct light substantially normal to a major surface of the first interference reflector 430.

In general, the light source 420 emits light having a first optical characteristic, which is directed by the optical cavity 470 toward the first interference reflector 430. The first interference reflector 430 substantially transmits light from the light source 420 such that it illuminates the emissive material 440. At least a portion of the light that is not transmitted by the first interference reflector 430 is collected by the optical cavity 470 and redirected toward the first interference reflector 430. When illuminated with light having the first optical characteristic, the emissive material 440 emits light having a second optical characteristic. At least a portion of light emitted by the emissive material 440 illuminates the second interference reflector 450. Any light emitted by the emissive material 440 toward the optical cavity 470 is substantially reflected by the first interference reflector 430 back toward the emissive material 440. Light emitted by the emissive material 440 that may be transmitted by the first interference reflector 430 is collected by the optical cavity 470 and directed back toward the first interference reflector 430. The second interference reflector 450, which substantially transmits light having the second optical characteristic and substantially reflects light having the first optical characteristic, substantially transmits light emitted by the emissive material 440 toward the input surface 416 of the light guide 412 where it is directed through the output surface 414 and subsequently to a desired location. Any light from the light source 420 that illuminates the second interference reflector 450 is substantially reflected back toward the emissive material 440 where it may be converted to light having the second optical characteristic.

Although FIG. 5 illustrates illumination system 400 as including a first interference reflector 430, in some embodiments, the system 400 may not include a first interference reflector. In such embodiments, the optical cavity 470 is positioned adjacent the emissive material 440 such that at least a portion of excitation light from the light source 420 illuminates the emissive material 440 without first illuminating an interference reflector.

Although not shown in FIG. 5, the illumination system 400 may also include one or more TIR promoting layers positioned adjacent one or both major surfaces of the emissive material 440 as is described, e.g., in reference to illumination system 10 of FIG. 1.

Figure 6A:
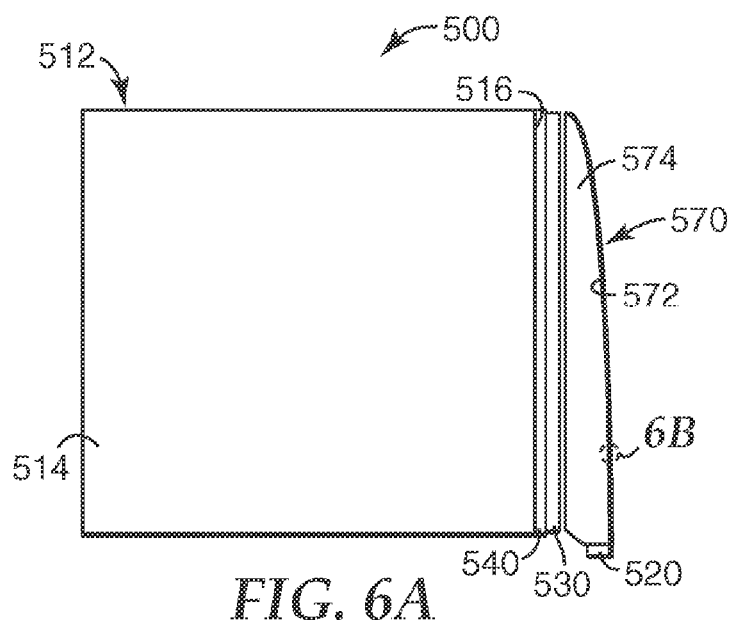
FIG. 6(A) is a schematic top plan view of one embodiment of an illumination system having an optical cavity that includes one or more facets.
Figure 6B:
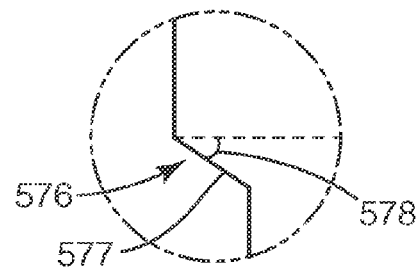
FIG. 6(B) is a schematic cross-section view of one portion of the optical cavity of the illumination system of FIG. 6(A).
Figure 6C:
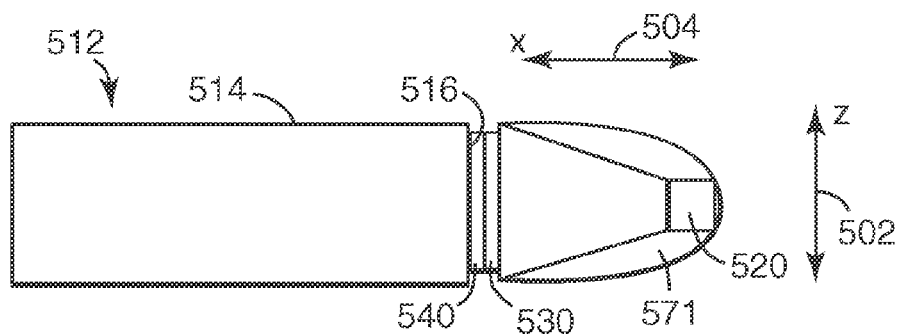
FIG. 6(C) is a schematic side view of the illumination system of FIG. 6(A).

The optical cavities of the present disclosure may use any suitable technique to direct light from a light source onto an interference reflector, emissive material, or light guide. For example, FIGS. 6(A)-(C) are schematic diagrams of another embodiment of an illumination system 500 that includes an optical cavity 570. The system 500 also includes a light guide 512 having an output surface 514 and an input surface 516, and a light source 520 optically coupled to the optical cavity 570. The system 500 further includes a first interference reflector 530 positioned between the light source 520 and the output surface 514 of the light guide 512, and emissive material 540 positioned between the first interference reflector 530 and the output surface 514 of the light guide 512. All of the design considerations and possibilities described herein with respect to the light guide 12, the light source 20, the first interference reflector 30, and the emissive material 40 of the embodiment illustrated in FIG. 1 apply equally to the light guide 512, the light source 520, the first interference reflector 530, and the emissive material 540 of the embodiment illustrated in FIGS. 6(A)-(C). The system 500 can also include a LP interference reflector as is further described herein (e.g., second interference reflector 150 of FIG. 2).

The optical cavity 570 includes an extended aperture (not shown) adjacent the first interference reflector 530. The light source 520 may be optically coupled to the optical cavity 570 using any suitable technique. For example, in FIGS. 6(A)-(C), the optical cavity 570 includes a collector 571 that collects light emitted by the light source 520 and directs it into optical cavity 570. In some embodiments, the collector 571 also collimates the emitted light. As used herein, the term "collector" refers to a non-imaging optical device that collects light emitted by one or more light sources and directs the collected light toward emissive material or an interference reflector.

In some embodiments, it may be preferred that the z-dimension 502 of the optical cavity 570 has a minimum value such that etendue is preserved while also maintaining total internal reflection (TIR) at the surfaces of the optical cavity 570. Such TIR at least in part depends on the refractive index of an interior space 574 of the optical cavity 570 and the etendue of the light source 520. If the light source 520 includes an LED die, then, in some embodiments, the LED die is assumed to emit into $2\pi$ steradians, in which case the TIR angle for a refractive index of 1.5 is about 42°. In such embodiments, the z-dimension 502 for a 300 μm LED die is equal to (300 μm)/sin(48°)=400 μm. If the z-dimension of the light guide 512 is 1000 μm, then the angle of incidence of the light on the first interference reflector 530 is equal to $\sin^{-1}$ ((300 μm)/(1000 μm))=17.5°.

The formula for band-edge shift with angle for a multilayer film is $$\lambda = \lambda(0)\cos(\Theta)$$

where $\Theta$ is the angle in the medium. The reflective band-edge shifts down by about 4%. Therefore, the blue band-edge selection for the first interference reflector 530 can be approximately 4% higher than one would choose for normal incidence.

The optical cavity 570 also includes an interior space 574. The interior space 574 includes one or more facets 576. Each facet 576 has a facet angle 578 that is selected such that the facets 576 direct excitation light toward the first interference reflector 530 at a substantially normal angle to a major surface of the first interference reflector 530. Each facet 576 has a reflective face 577 that reflects light from light source 520. Any suitable material or materials may be used to form facets 576.

If the reflective surface 577 of facet 576 includes a multilayer optical film, then the minimum x-dimension 504 of the optical cavity 570, which insures that there is little or no leakage through the facet 576 depends upon the facet angle 578. For example, if the facet angle 578 is 45°, then some light may exceed the TIR angle at the surface 577 if the spread of light exceeds ±3°. A facet angle 578 of 45° out-couples rays at substantially normal incidence to the first interference reflector 530. However, in some embodiments, it may not be necessary to illuminate the first interference reflector 530 at perfectly normal incidence. For example, 10° or 20° incidence can be sufficient to ensure that substantially all of the light from the light source 520 transmits through to the emissive material 540. If the light spread ΔΘ is ±3° in the optical cavity 570, then the x-dimension equals 5700 μm or 5.7 mm. Table 1 includes x-dimensions 504 for the optical cavity 570 given various light spread (ΔΘ) values.

TABLE 1

| LED x-dimension | ΔΘ | Optical Cavity x-dimension |
|---|---|---|
| 300 μm | ±3° | 5.7 mm |
| 300 μm | ±5° | 3.4 mm |
| 300 μm | ±10° | 1.7 mm |
| 300 μm | ±15° | 1.2 mm |

Although the optical cavity 570 is positioned adjacent the input edge 516 of the light guide 512, the optical cavity 570 first interference reflector 530, and emissive material 540 may positioned in any suitable location relative to the light guide 512. For example, in some embodiments, the optical cavity 570, first interference reflector 530, and emissive material 540 may be positioned adjacent a major surface of the light guide 512 as is further described herein.

Figure 6D:
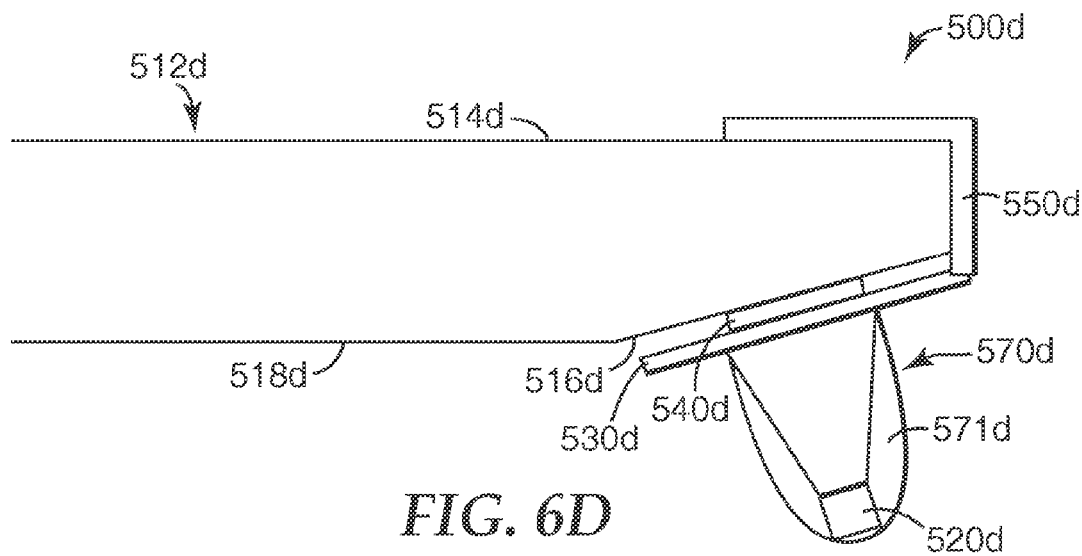
FIG. 6(D) is a schematic side view of another embodiment of an illumination system having an optical cavity that includes one or more facets.

Some handheld light guides (e.g., light guides used in displays for handheld electronic devices) are about 1 mm in thickness. The slim 1 mm dimension can increase the complexity of converting and assembling the first interference reflector 530 and the emissive material 540. If the thickness of the light guide 512 is less than 1 mm, then the embodiment schematically illustrated in FIG. 6(D) may be more useful. In FIG. 6(D), the optical cavity 570d is adjacent a sloped input surface 516d, which may allow for a larger first interference reflector 530d. The wedge formed by the light guide 512d provides a zone for light to expand and match the numerical aperture (NA) of the light guide 512d. An optional second interference reflector 550d that substantially transmits light emitted by the emissive material 540d and substantially reflects light emitted by the light source 520d may be positioned on the output surface 514d and/or end of the light guide 512d opposite the input surface 516d to help prevent light that is not converted by the emissive material 540d from leaving the light guide 512d.

Figure 6E:
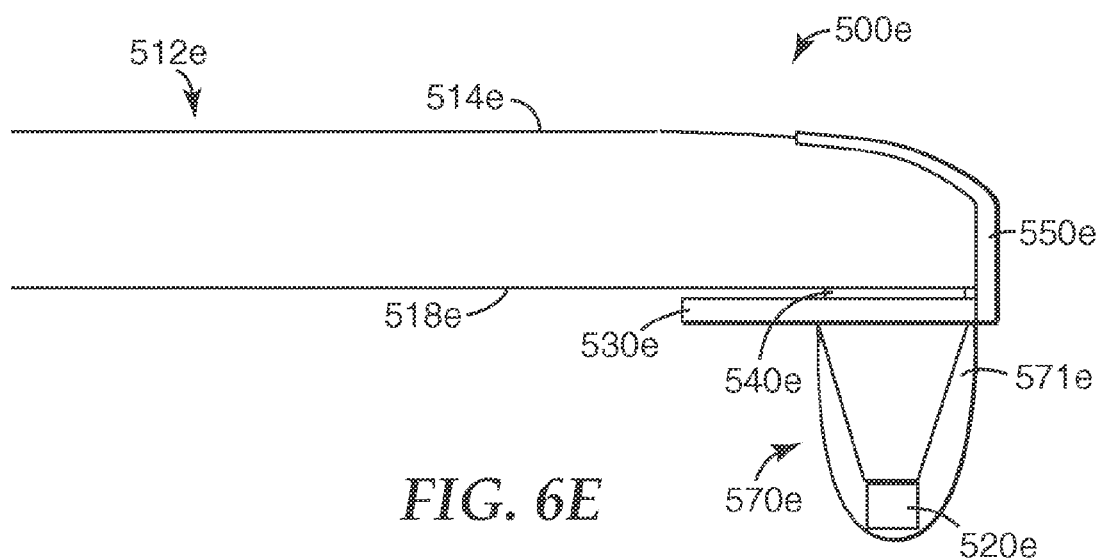
FIG. 6(E) is a schematic side view of another embodiment of an illumination system having an optical cavity that includes one or more facets.

FIG. 6(E) schematically illustrates another embodiment of an illumination system 500e where the optical cavity 570e is positioned adjacent a bottom surface 518e of light guide 512e. Such a design may allow for larger first interference reflectors 530e and emissive material 540e areas for smaller light guides 512e. The system 500e also includes a second interference reflector 550e positioned on the output surface 514e and an end of the light guide 512e to prevent light that is not converted by the emissive material 540e from leaving the light guide 512e.

Figure 7:
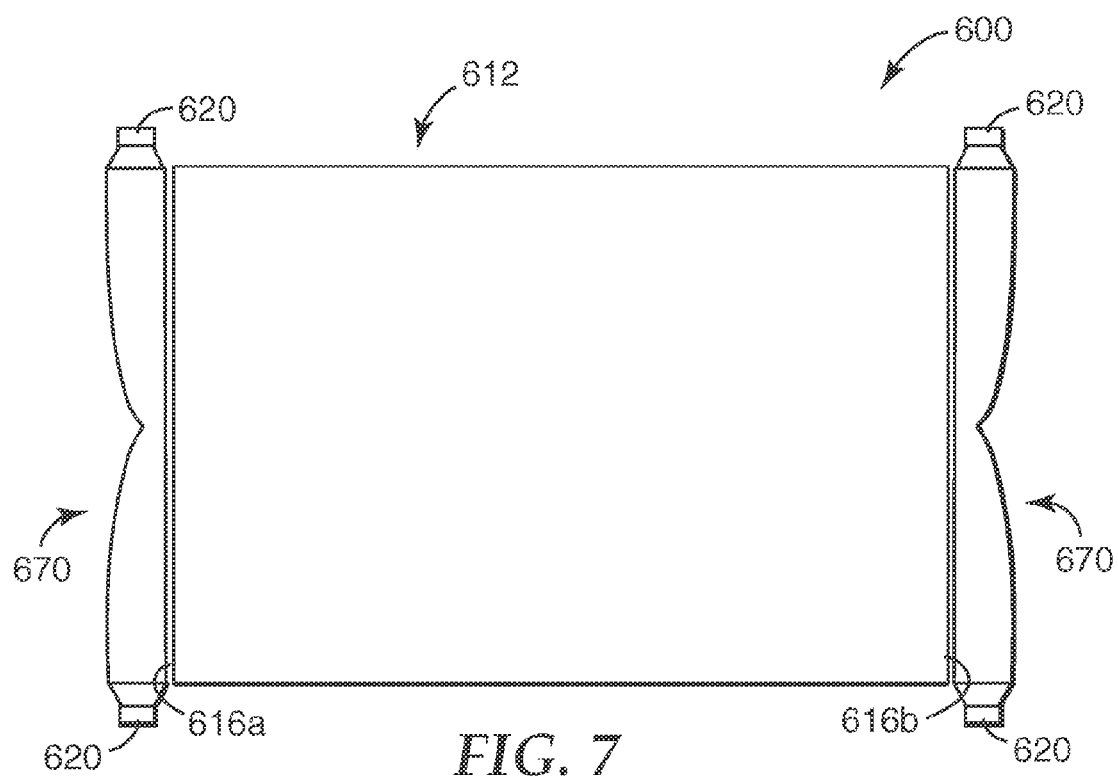
FIG. 7 is a schematic top plan view of another embodiment of an illumination system having four optical cavities that each include one or more facets.

Although FIGS. 6(A)-(E) include systems having one light source, some embodiments can include two or more light sources. For example, FIG. 7 schematically illustrates an illumination system 600 including four light sources 620, each optically coupled to optical cavities 670. Optical cavities 670 may include any suitable optical cavity described herein, e.g., optical cavity 570 of FIGS. 6(A)-(C). Each optical cavity 670 is positioned adjacent an input surface 616a and 616b of the light guide 612. The illumination system 600 may include any suitable system as described herein, e.g., illumination system 100 of FIG. 2. Although system 600 includes optical cavities 670 adjacent two input surfaces 616(a) and 616(b) of light guide 612, the system 600 may include any suitable number of optical cavities positioned in any suitable location such that additional light sources may be provided.

Figure 8A:
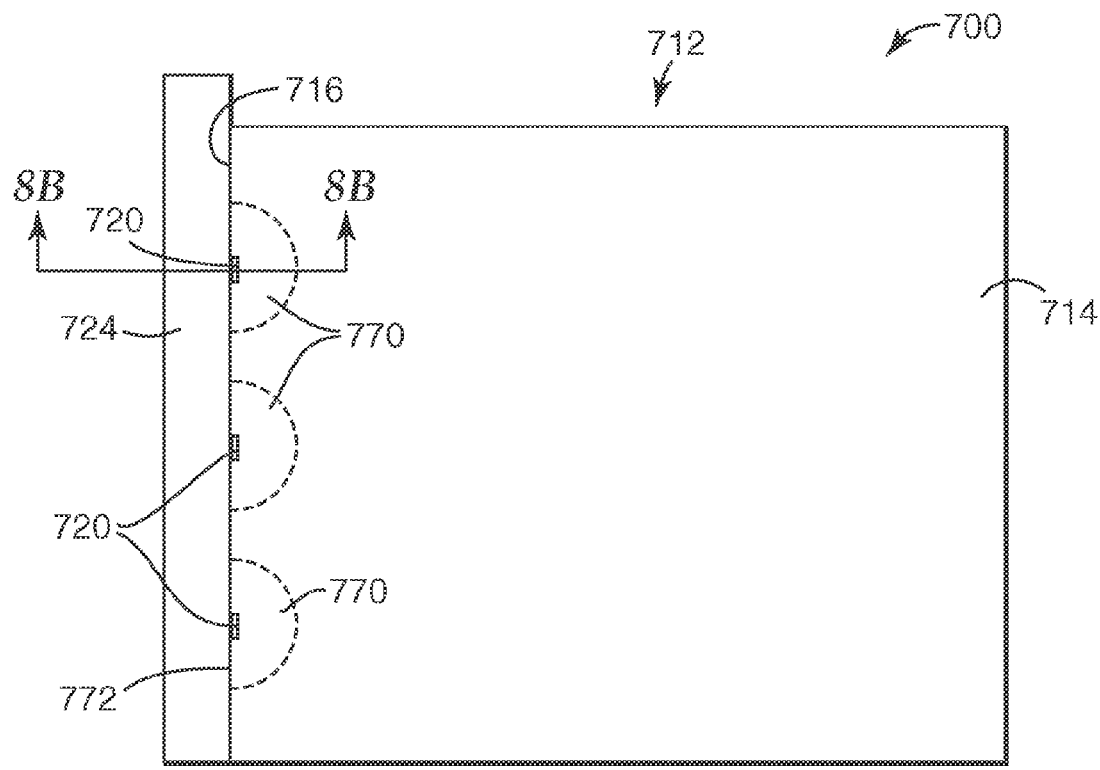
FIG. 8(A) is a schematic top plan view of an embodiment of an illumination system having a short pass interference reflector located within one or more optical cavities located within a light guide.
Figure 8B:
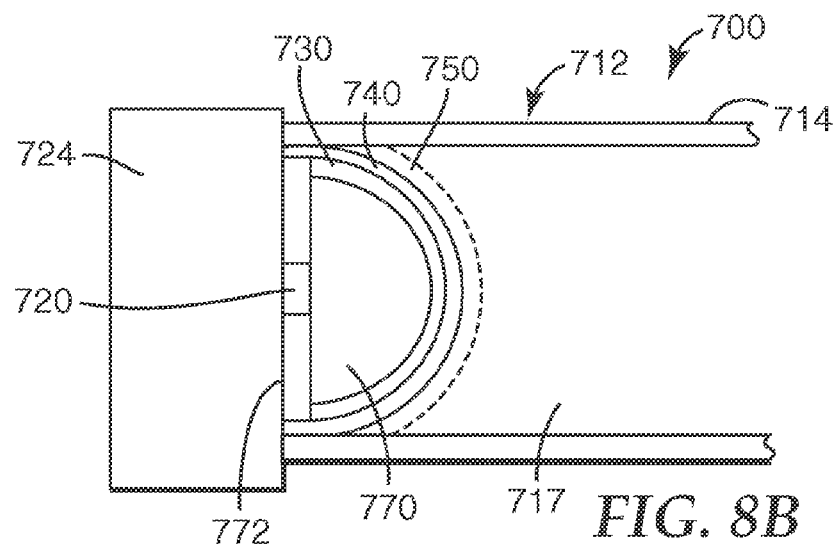
FIG. 8(B) is a schematic cross-section view of the illumination system of FIG. 8A taken along line 8B-8B.

As is also further described herein, any of the disclosed interference reflectors may be curved to aid in maintaining a substantially normal angle of incidence of light emitted by a point source onto the interference reflectors. For example, FIGS. 8(A)-(B) schematically illustrate one embodiment of an illumination system 700 having a curved first interference reflector 730. The illumination system 700 is similar to the illumination system 10 of FIG. 1. The system 700 includes a light guide 712 having an output surface 714 and an input surface 716, and one or more light sources 720. The system 700 further includes a first interference reflector 730 positioned between the one or more light sources 720 and the output surface 714, and emissive material 740 positioned between the first interference reflector 730 and the output surface 714 of the light guide 712. All of the design considerations and possibilities described herein with respect to the light guide 12, the light source 20, the first interference reflector 30, and the emissive material 40 of the embodiment illustrated in FIG. 1 apply equally to the light guide 712, each of the one or more light sources 720, the first interference reflector 730, and the emissive material 740 of the embodiment illustrated in FIGS. 8(A)-(B). The system 700 may also include optional second interference reflector 750 positioned between the emissive material 740 and the output surface 714 of the light guide 712 as is further described herein.

In the embodiment illustrated in FIGS. 8(A)-(B), the one or more light sources 720 may be mounted on interconnect assembly 724. Any suitable interconnect assembly may be used, e.g., those assemblies described in co-owned and copending U.S. Patent Application Publication No. 2005/0116235 (Schultz et al.).

The system 700 further includes one or more optical cavities 770 positioned within the light guide 712. In the embodiment illustrated in FIGS. 8(A)-(B), each light source 720 is associated with an optical cavity 770. The one or more optical cavities 770 may take any suitable shape, e.g., cylindrical, hemispherical, etc. In the embodiment illustrated in FIGS. 8(A)-(B), each optical cavity 770 is hemispheric in shape. All of the one or more optical cavities 770 may take the same shape. Alternatively, one or more optical cavities 770 may take different shapes. Further, each optical cavity 770 may be of any suitable size.

The optical cavities may be bounded by reflective surface 772. Any suitable material or materials may be used to form reflective surface 772. It may be preferred that the reflective surface 772 include a broadband interference reflector as described, e.g., in U.S. Pat. No. 5,882,774 (Jonza et al.).

In the embodiment illustrated in FIGS. 8(A)-(B), the one or more optical cavities 770 are positioned in an interior space 717 of the light guide 712. The one or more optical cavities 770 may be formed using any suitable technique. For example, the one or more optical cavities 770 may be formed as indentations in the input surface 716 of the light guide 712. Any suitable number of optical cavities 770 may be included in the illumination system 700. Further, although FIGS. 8(A)-(B) illustrate optical cavities 770 on one edge of light guide 712, the system 700 may include optical cavities 770 on two or more sides of the light guide 712 or on one or more major surfaces of the light guide 712.

In some embodiments, each light source 720 may be positioned proximate a center of curvature of each optical cavity 770. By placing the light source 720 proximate the center of curvature of each optical cavity 770, light emitted by the light source 720 may illuminate the first interference reflector 730 substantially normal to a major surface of the first interference reflector 730, thereby eliminating some bandedge shift. In other words, spacing the first interference reflector 730 away from the light source 720 and curving it in towards the light source 720 may help reduce the range of incident angles of light impinging on the first interference reflector 730, thereby reducing the leakage of light through the first interference reflector 730 caused by the blue-shift effect as described herein.

In general, light having a first optical characteristic is emitted by the light source 720 and is substantially transmitted by the first interference reflector 730. The transmitted light illuminates the emissive material 740, causing the emissive material 740 to emit light having a second optical characteristic. Any light emitted by the emissive material 740 toward the light source 720 is substantially reflected by the first interference reflector 730. Further, any light not transmitted by the first interference reflector 730 is substantially reflected by the reflective surface 772 and directed back toward the first interference reflector 730. The light emitted by the emissive material 740 is then directed by the light guide 712 through the output surface 714 to a desired location. If an optional second interference reflector 750 is included between the emissive material 740 and the output surface 714, it may be preferred that the second interference reflector 750 substantially transmits light having the second optical characteristic and substantially reflects light having the first optical characteristic. In such an exemplary embodiment, the light emitted by the emissive material 740 would be substantially transmitted by the second interference reflector 750 and directed by the light guide 712 through the output surface 714 to a desired location. Light emitted by the light source 720 that passes through the emissive material 740 without being absorbed is substantially reflected by the second interference reflector 750 back toward the emissive material 740.

As previously described herein, some light sources of the present disclosure emit excitation light in a pattern having a solid angle of $2\pi$ steradians or greater. In some embodiments, a collector may be used to collect light emitted by a light source and collimate the collected light such that the light is directed toward an interference reflector or emissive material at substantially normal angles.

Figure 9A:
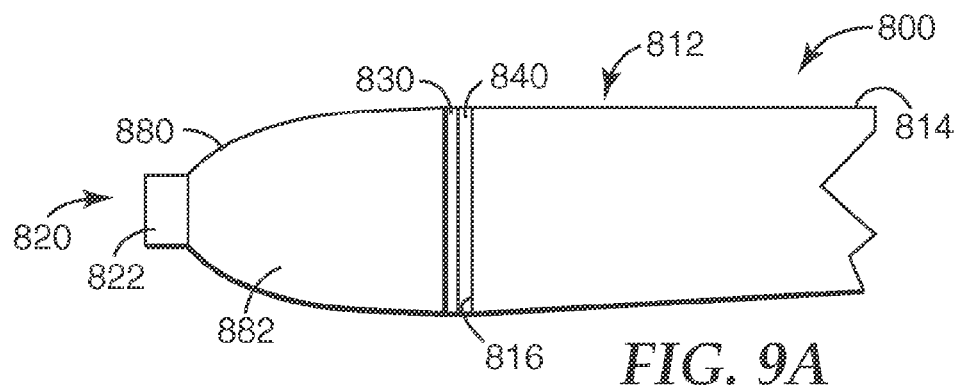
FIG. 9(A) is a schematic side view of an embodiment of an illumination system having one or more optical cavities adjacent an input surface of a light guide.
Figure 9B:
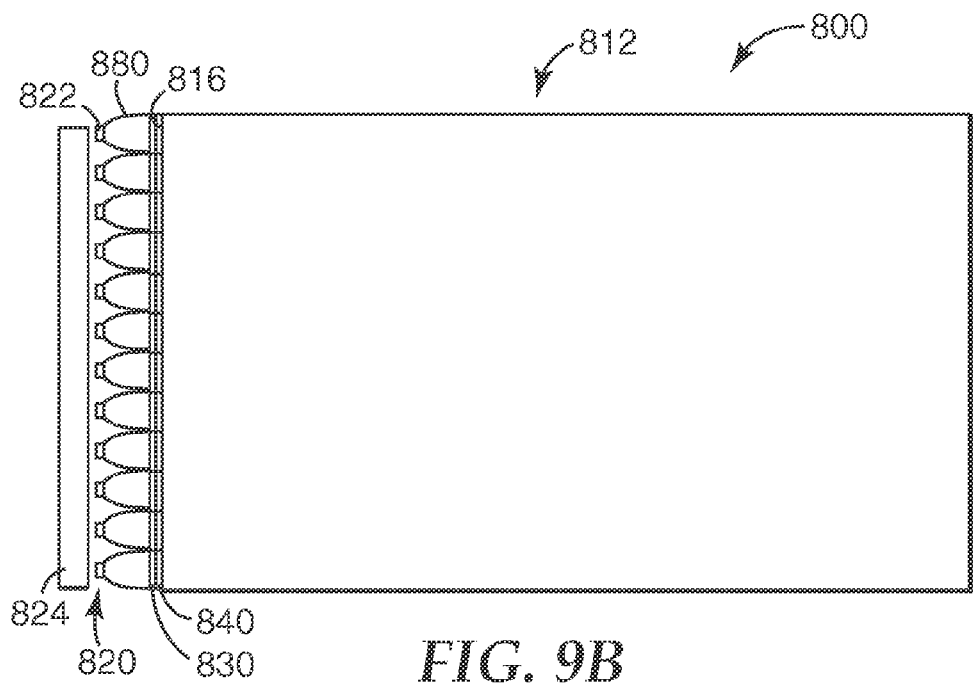
FIG. 9(B) is a schematic top plan view of the illumination system of FIG. 9(a).

FIGS. 9(A)-(B) schematically illustrate one embodiment of an illumination system 800 having one or more collectors 880. The illumination system 800 includes a light guide 812 having an output surface 814 and an input surface 816, and a light source 820. In the embodiment illustrated in FIGS. 9(A)-(B), the light source 820 includes one or more LEDs 822 optionally mounted on an interconnect assembly 824 as is further described herein. The system 800 also includes a first interference reflector 830 positioned between the light source 820 and the output surface 814, and emissive material 840 positioned between the first interference reflector 830 and the output surface 814 of the light guide 812. All of the design considerations and possibilities described herein with respect to the light guide 12, the light source 20, the first interference reflector 30, and the emissive material 40 of the embodiment illustrated in FIG. 1 apply equally to the light guide 812, the light source 820, the first interference reflector 830, and the emissive material 840 of the embodiment illustrated in FIGS. 9(A)-(B). Although not shown, the system 800 may also include an optional LP interference reflector between the emissive material 840 and the output surface 814 as previously described herein.

One difference between the illumination system 800 of FIGS. 9(A)-(B) and the illumination system 10 of FIG. 1 is that each LED 822 is associated with a collector 880. Each collector 880 forms an optical cavity 882 that directs light emitted by the LED 822 toward the first interference reflector 830. Each collector 880 may take any suitable shape, e.g., spherical, parabolic, or elliptical. It may be preferred that each collector 880 take a shape that allows for collimation of the light emitted by the light source 820. Further, it may be preferred that each collector 880 be shaped such that it collects the light emitted by the LED 822 and directs the light toward the first interference reflector 830 such that the excitation light is incident upon the first interference reflector 830 at an angle that is substantially normal to a major surface of the first interference reflector 830. The collectors 880 can reduce the angular spread of light impinging on the first interference reflector 830, thus reducing the blue-shift of the reflection band as is further described herein. Each collector 880 may be in the form of simple conical sections with flat sidewalls, or the sidewalls can take on a more complex curved shape as is known to enhance collimation or focusing action depending on the direction of light travel. It may be preferred that the sidewalls of the collectors 880 are reflective and the two ends are not. It may also be preferred that the collector's sidewalls include a broadband interference reflector as is further described herein. Each collector 880 may be positioned in any suitable relationship to the first interference reflector 830. For example, each collector 880 may be spaced apart from the first interference reflector 830. Alternatively, one or more collectors 880 may be in contact with the first interference reflector 830.

Although the system 800 is illustrated as having a light source 820 positioned adjacent one input surface 816 of light guide 812, the system 800 can include two or more light sources positioned adjacent two or more input surfaces of the light guide 812.

Figure 10A:
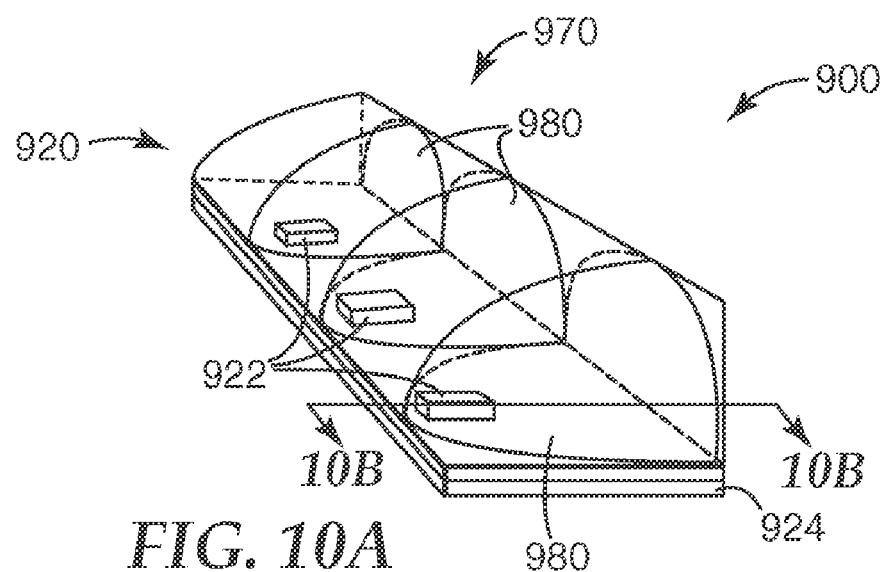
FIG. 10(A) is a schematic perspective view of one embodiment of an illumination system having one or more optical cavities adjacent an input surface of a light guide.
Figure 10B:
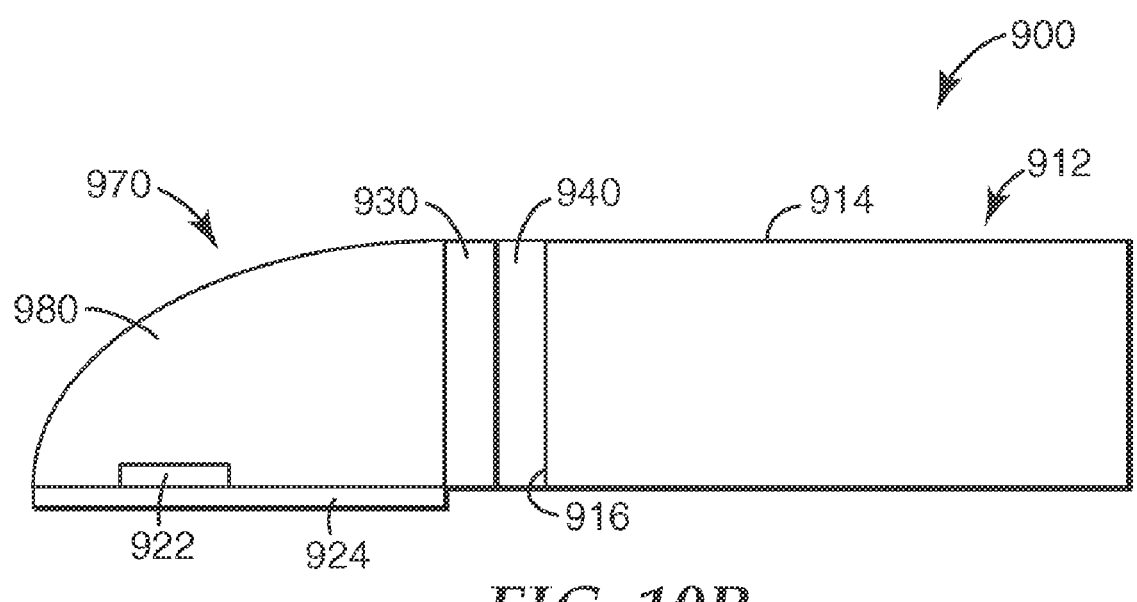
FIG. 10(B) is a schematic cross-section view of the illumination system of FIG. 10(a) taken along line 10B-10B.

Any suitable device or technique may be used with the embodiments of the present disclosure to direct light from a light source toward an interference reflector such that the light is incident upon the interference reflector at substantially normal angles. For example, FIGS. 10(A)-(B) schematically illustrate one embodiment of an illumination system 900 that includes an optical cavity 970 having collectors 980 formed in the optical cavity 970. The system 900 includes light source 920. The light source 920 includes one or more LEDs 922. In this embodiment, the light source 920 is positioned adjacent an input surface 916 of light guide 912. The system 900 further includes a first interference reflector 930 positioned between the light source 920 and the output surface 914, and emissive material 940 positioned between the first interference reflector 930 and the output surface 914. All of the design considerations and possibilities in regard to the light guide 12, the light source 20, the first interference reflector 30, and the emissive material 40 of the embodiment illustrated in FIG. 1 apply equally to the light guide 912, the light source 920, the first interference reflector 930, and the emissive material 940 of the embodiment illustrated in FIGS. 10(A)-(B). The system 900 may also include a LP interference reflector, e.g., second interference reflector 150 of FIG. 2.

The optical cavity 970 is positioned to direct light emitted by the light source 920 into the light guide 912. The optical cavity 970 includes collectors 980 formed in the optical cavity 970. Each LED 922 has a corresponding collector 980. In some embodiments, two or more LEDs 922 may be positioned within a single collector 980. The collectors 980 may each take any suitable shape, e.g., hemispherical, parabolical, or cylindrical. In FIGS. 10(A)-(B), the collectors 980 are shaped as a two-dimensional conic sections. It may be preferred that each collector 980 is shaped such that light emitted by each LED 922 illuminates the first interference reflector 930 at substantially normal angles to a major surface of the first interference reflector 930. The collectors 980 collect light emitted by the LEDs 922 and direct the collected light such that it illuminates the first interference reflector 930. Further, it may be preferred that one or more LEDs 922 may be positioned proximate a focus of one or more collectors 980.

Any suitable technique may be used to form optical cavity 970 and collectors 980. In some embodiments, the LEDs 922 may be potted with a flat slab encapsulant and index-matched to the optical cavity 970. Further, the first interference reflector 930 and the emissive material 940 may be optically coupled to the optical cavity 970 using any suitable material or materials, e.g., optical adhesives, etc. It may be preferred that a TIR promoting layer may be positioned between the optical cavity 970 and the light guide 912 for better NA match of the light emitted by the emissive material 940 into the light guide 912.

In some embodiments, the LEDs 922 may be mounted on an interconnect assembly 924. Any suitable interconnect assembly may be used, e.g., those interconnect assemblies described in co-owned and copending U.S. Patent Application Publication No. 2005/0116235 (Schultz et al.). In an exemplary embodiment, the optical cavity 970 may be formed on interconnect assembly 924 using any suitable technique.

The collectors 980 may include a reflective inner surface such that light emitted by each LED 922 is reflected toward the first interference reflector 930. It may be preferred that one or more collectors 980 include a broadband interference reflector positioned in the collector 980 to reflect light toward the first interference reflector 930.

As previously described herein, the interference reflectors and emissive material of the present disclosure may be positioned in any suitable relationship to the light guide. For example, the first interference reflector 30 and emissive material 40 of illumination system 10 of FIG. 1 are positioned adjacent the input surface 16 of the light guide 12. In some embodiments, conversion of light can occur adjacent an output surface of a light guide. In other words, light from a light source may be directed by a light guide through an output surface of the light guide and subsequently converted by emissive material positioned on or adjacent the output surface of the light guide. Depending upon the types of light sources and interference reflectors selected, positioning the emissive material and interference reflectors a distance from the light source may prevent damage to the emissive material and/or the interference reflectors.

For example, polymeric interference reflectors can be degraded by overheating which can cause material creep thereby changing the layer thickness values and therefore the optical characteristics of the light (e.g., wavelength) that the reflector reflects. In the worst case, overheating can cause the polymer materials to melt, resulting in rapid flow of material and change in optical characteristic selection as well as inducing non-uniformities in the filter.

Degradation of polymer materials can also be induced by short wavelength (actinic) radiation such as blue, violet, or UV radiation, depending on the polymer material. The rate of degradation is dependent both on the actinic light flux and on the temperature of the polymer. Both the temperature and the flux will, in general, decrease with increasing distance from the light source. Thus it is advantageous in cases of high brightness light sources, particularly UV emitting light sources, to place polymeric interference reflectors as far from the light source as the design can allow.

FIG. 11 schematically illustrates one embodiment of an illumination system 1000 including a light guide 1012 having an output surface 1014 and an input surface 1016, and a light source 1020. The light source 1020 emits light having a first optical characteristic. The system 1000 also includes emissive material 1040 positioned to receive light from the output surface 1014 of the light guide 1012, and a first interference reflector 1030 positioned between the emissive material 1040 and the output surface 1014 of the light guide 1012. The emissive material 1040 emits light having a second optical characteristic when illuminated with light having the first optical characteristic. The first interference reflector 1030 substantially transmits light having the first optical characteristic and substantially reflects light having the second optical characteristic. All of the design considerations and possibilities described herein with respect to the light guide 12, the light source 20, the first interference reflector 30, and the emissive material 40 of the embodiment illustrated in FIG. 1 apply equally to the light guide 1012, the light source 1020, the first interference reflector 1030, and the emissive material 1040 of the embodiment illustrated in FIG. 11. The system 1000 may also include a second interference reflector 1050 positioned such that the emissive material 1040 is between the second interference reflector 1050 and the first interference reflector 1030. Any suitable interference reflector described herein may be utilized for the second interference reflector 1050 (e.g., second interference reflector 150 of FIG. 2). The second interference reflector 1050 may help to prevent some or all of the light emitted by the light source 1020 from reaching a viewer facing the output surface 1014 of the light guide 1012. The second interference reflector 1050 may be positioned in any suitable location. In some embodiments, the second interference reflector 1050 may be positioned on and in contact with the emissive material 1040.

The first interference reflector 1030 may be positioned adjacent the output surface 1014, on the output surface 1014, on the emissive material 1040, or in any other suitable location. In one exemplary embodiment, the first interference reflector 1030 may be on and in contact with both the emissive material 1040 and the output surface 1014 of the light guide 1012. In some embodiments, system 1000 may also include one or more TIR promoting layers between the output surface 1014 and the first interference reflector 1030, and/or an extraction device or devices on output surface 1014 to extract light from the light guide 1012. Any suitable extraction device may be utilized.

In some embodiments, an extraction device or devices may be included adjacent a bottom surface 1018 of the light guide 1012 to direct at least a portion of light within the light guide 1012 though the output surface 1014. Any suitable extraction device or devices may be utilized.

In some embodiments, the illumination system 1000 may include a TIR promoting layer in contact with the emissive material 1040 between the first interference reflector 1030 and the emissive material 1040. It may be preferred that the TIR promoting layer include an index of refraction at the wavelength of light emitted by the light source 1020 that is less than the index of refraction of the emissive material 1040. Any suitable material or materials may be used for the TIR promoting layer. The TIR promoting layer may include an air gap; alternatively, the TIR promoting layer may include a microstructured layer.

A second TIR promoting layer may be positioned in contact with the emissive material 1040 between the emissive material 1040 and the optional second interference reflector 1050. It may be preferred that the second TIR promoting layer include an index of refraction at the wavelength of light emitted by the light source 1020 that is less than the index of refraction of the emissive material 1040.

Although not shown, the system 1000 may include one or more optical elements positioned to receive light emitted by the emissive material 1040. Alternatively, the one or more optical elements may be positioned between the output surface 1014 and the first interference reflector 1030, and/or between the light source 1020 and the output surface 1014 of the light guide 1014. If a second interference reflector 1050 is included, then one or more optical elements may be positioned between the emissive material 1040 and the second interference reflector 1050, and/or such that the second interference reflector is between the emissive material 1040 and the one or more optical elements. The one or more optical elements may include any suitable optical element as is further described herein.

In general, light having a first optical characteristic is emitted by the light source 1020, at least a portion of which enters the light guide 1012 and is directed through the output surface 1014. At least a portion of the light from the light guide 1012 illuminates the first interference reflector 1030 and is substantially transmitted. At least a portion of the transmitted light illuminates the emissive material 1040, thereby causing the emissive material 1040 to emit light having a second optical characteristic. Light emitted by the emissive material 1040 can then be directed to a desired location using any suitable technique. Any light emitted by the emissive material 1040 toward the first interference reflector 1030 is substantially reflected back toward the emissive material. If a second interference reflector 1050 is included in system 1000, then light emitted by the emissive material 1040 that illuminates the second interference reflector 1050 is substantially transmitted and directed to a desired location. Any light emitted by the light source 1020 that illuminates the second interference reflector 1050 is substantially reflected back toward the emissive material 1040 where it may be converted to light having the second optical characteristic.

Figure 17:
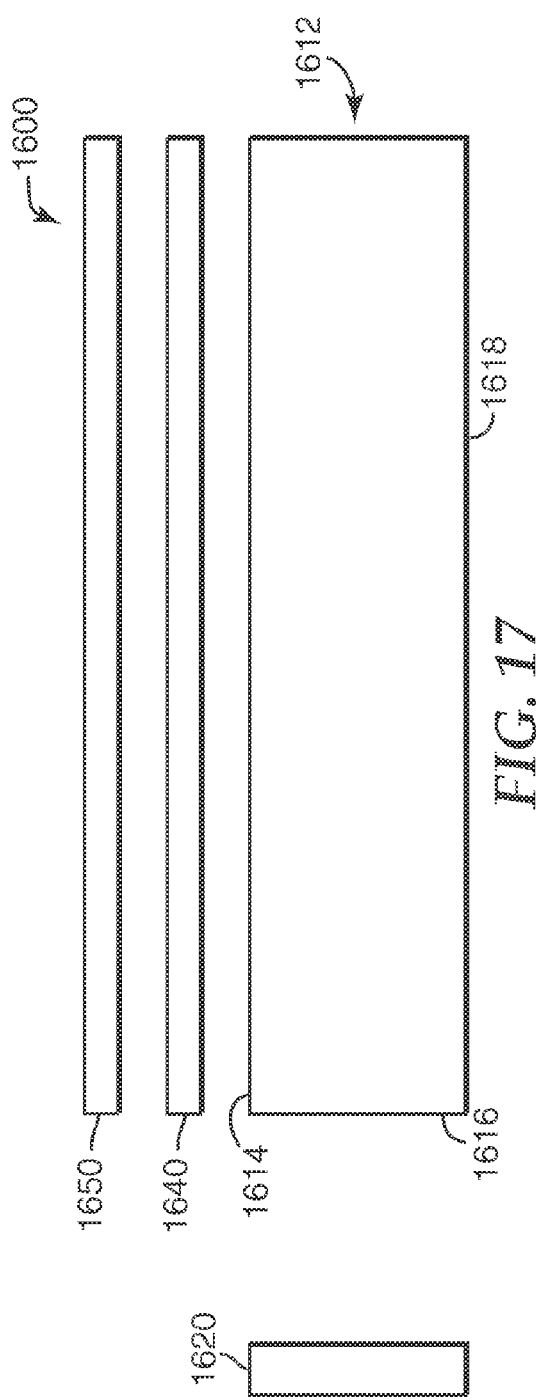
FIG. 17 schematically illustrates an embodiment of an illumination system having a long pass interference reflector positioned such that emissive material is between an output surface of a light guide and the long pass interference reflector.

Alternatively, some embodiments of illumination systems of the present disclosure may include a LP interference reflector and no SP interference reflector. For example, FIG. 17 schematically illustrates an embodiment of an illumination system 1600 that includes a light source 1620 and a light guide 1612 having an output surface 1614 and an input surface 1616. The light source 1620 emits light having a first optical characteristic. The system 1600 also includes emissive material 1640 positioned to receive light from the output surface 1614 and an interference reflector 1650 positioned such that the emissive material 1640 is between the output surface 1614 and the interference reflector 1650. The emissive material 1640 emits light having a second optical characteristic when illuminated with light having the first optical characteristic. In this exemplary embodiment, the interference reflector 1650 substantially transmits light having the second optical characteristic and substantially reflects light having the first optical characteristic. All of the design considerations and possibilities described herein with respect to the light guide 1012, the light source 1020, the emissive material 1040, and the second interference reflector 1050 of the embodiment illustrated in FIG. 11 apply equally to the light guide 1612, the light source 1620, the emissive material 1640, and the interference reflector 1650 of the embodiment illustrated in FIG. 17. The illumination system 1600 may also include other elements as described in reference to illumination system 1000 of FIG. 11, e.g., one or more optical elements, TIR promoting layers, etc.

In general, light having a first optical characteristic is emitted by the light source 1620, at least a portion of which enters the light guide 1612 and is directed through the output surface 1614. At least a portion of the light from the light guide 1612 illuminates the emissive material 1640, thereby causing the emissive material 1640 to emit light having a second optical characteristic. At least a portion of the light emitted by the emissive material 1640 is substantially transmitted by the interference reflector 1650 and directed to a desired location using any suitable technique. Any light emitted by the light source 1020 that illuminates the interference reflector 1050 is substantially reflected back toward the emissive material 1040 where it may be converted to light having the second optical characteristic.

FIG. 12 schematically illustrates another embodiment of an illumination system 1100. The system 1100 includes a light guide 1112 having an output surface 1114 and an input surface 1116, and a light source 1120. The light source 1120 emits light having a first optical characteristic. The system 1100 further includes a first interference reflector 1130 positioned adjacent the output surface 1114. The first interference reflector 1130 substantially transmits light having the first optical characteristic and substantially reflects light having a second optical characteristic. The first interference reflector 1130 includes indentations 1134 formed in a first major surface 1132 of the first interference reflector 1130. The system 1100 also includes emissive material 1140 positioned to receive excitation light from the output surface 1114 of the light guide 1112. The system 1100 may also include an optional LP interference reflector (not shown) positioned such that the emissive material 1140 is between the LP interference reflector and the first interference reflector 1130. All of the design consideration and possibilities in regard to the light guide 112, the light source 120, the first interference reflector 130, the emissive material 140, and the second interference reflector 150 of the embodiment illustrated in FIG. 2 apply equally to the light guide 1112, the light source 1120, the first interference reflector 1130, the emissive material 1140, and the optional LP interference reflector of the embodiment of FIG. 12.

The emissive material 1140 includes dots 1142 that are positioned within indentations 1134 formed in the major surface 1132 of the interference reflector 1130. Each phosphor dot can have any suitable size. For example, each dot can have an area in plan view of less than 10000 $\mu m^2$ or from 500 to 10000 $\mu m^2$. In an illustrative embodiment, the dots can each be formed from emissive material that emits light having the second optical characteristic when illuminated with light having the first optical characteristic. In some embodiments, the emissive material 1140 includes one or more dots that emit one or more emitted wavelengths of visible light, e.g., a dot emitting red, a dot emitting blue, and a dot emitting green. For example, phosphor dot 1142R may emit red light when illuminated with light from the light source 1120, phosphor dot 1142G may emit green light, and phosphor dot 1142B may emit blue light.

The dots 1142 may be arranged and configured in any uniform or non-uniform manner as desired. For example, the emissive material 1140 can be a number of dots with a non-uniform density gradient along a surface or an area. The dots can have any regular or irregular shape and need not be round in plan view.

In general, structured phosphor layers, e.g., dots, can be configured in several ways to provide benefits in performance as described herein. When various types of emissive materials are used (e.g., red emitters, green emitters, etc.), light emitted from shorter wavelength emissive materials can be re-absorbed by other emissive materials. Patterns including isolated dots, lines, or isolated regions of each type can reduce the amount of reabsorption.

Any suitable technique may be used to provide indentations 1134 in the major surface 1132 of interference reflector 1030, e.g., thermoforming, embossing, knurling, laser marking or ablating, abrading, cast and cure, etc. Alternatively, the first interference reflector 1030 may be thermoformed to provide reflective wells or pockets within which emissive material 1140 may be placed. The indentations 1134 may be formed in any pattern. Each indentation 1134 may have any suitable depth. It may be preferred that each indentation 1134 be relatively shallow such that the first interference reflector 1130 is not excessively thinned. Such thinning may cause a large wavelength shift due to thickness or angle effects.

Although FIG. 12 illustrates the emissive material 1140 as including dots 1142, the emissive material 1140 may be formed in any suitable shape and/or pattern, e.g., lines, discrete shapes, or half-tones patterned in graded density and/or size.

Figure 13:
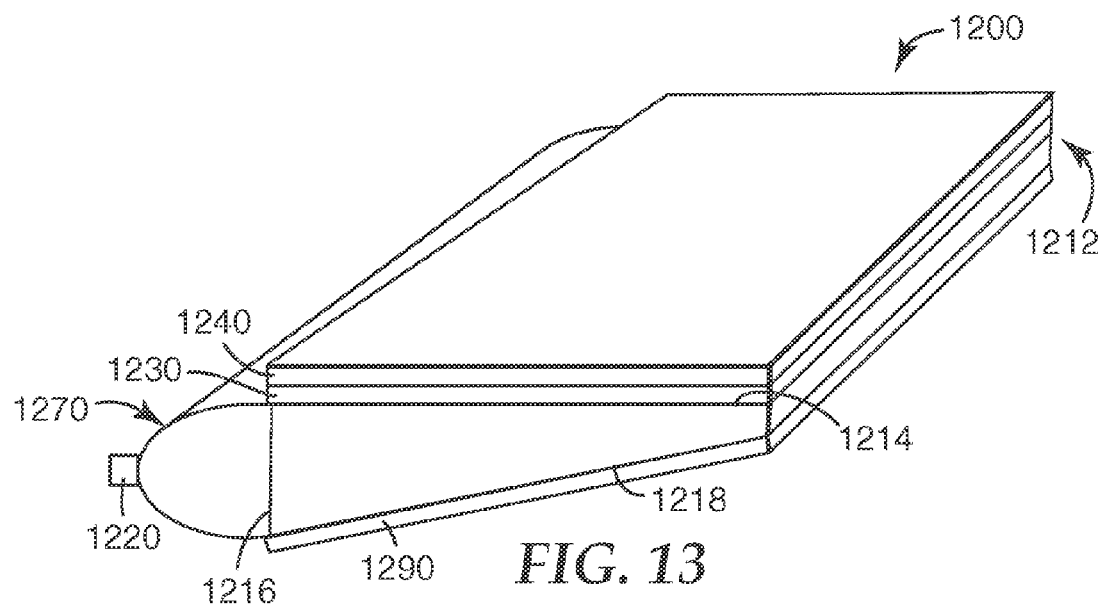
FIG. 13 is a schematic perspective view of one embodiment of an illumination system having a wedge-shaped light guide.

The light guides of the present disclosure can take any suitable shape. For example, FIG. 13 is a schematic diagram of another embodiment of an illumination system 1200. The system 1200 is similar in many respects to the illumination system 1000 of FIG. 11. The illumination system 1200 includes a light guide 1212 having an output surface 1214 and an input surface 1216, and a light source 1220. The system 1200 also includes emissive material 1240 positioned to receive light emitted by the light source 1220 from the output surface 1214 of the light guide 1212, and a first interference reflector 1230 positioned between the emissive material 1240 and the output surface 1214. All of the design considerations and possibilities described herein with respect to the light guide 1012, the light source 1020, the first interference reflector 1030, and the emissive material 1040 of the embodiment illustrated in FIG. 11 apply equally to the light guide 1212, the light source 1220, the first interference reflector 1230, and the emissive material 1240 of the embodiment illustrated in FIG. 13. The system 1200 may also include a LP interference reflector (e.g., second interference reflector 1050 of FIG. 11) positioned such that the emissive material 1240 is between the first interference reflector 1230 and the LP interference reflector.

The system 1200 also includes an optical cavity 1270 optically coupled to the light source 1220 that directs excitation light from the light source 1220 into the light guide 1212. Any suitable optical cavity 1270 may be used, e.g., optical cavity 470 of the embodiment illustrated in FIG. 5.

The light guide 1212 also includes a reflective bottom surface 1218 that forms an angle with the output surface 1214 such that the light guide 1212 takes a wedge-like shape that tapers distal from the input surface 1216. The reflective bottom surface 1218 may include any suitable reflective material or materials. It may be preferred that the reflective bottom surface 1218 include a broadband interference reflector 1290 as described, e.g., in U.S. Pat. No. 5,882,774 (Jonza et al.). The broadband interference reflector 1290 may be in contact with or spaced from bottom surface 1218.

In some embodiments, a TIR promoting layer may be positioned between the output surface 1214 and the first interference reflector 1230, and/or between the first interference reflector 1230 and the emissive material 1240 as is previously described herein.

The use of a wedged light guide 1212 may provide substantially normal incidence of the light emitted by the light source 1220 on the first interference reflector 1230, thereby allowing transmission of substantially all of the light on the first pass towards the first interference reflector 1230. In embodiments where there is a TIR promoting layer between the output surface 1214 and the first interference reflector 1230, light directed toward the output surface 1214 from within the light guide 1212 at oblique angles may be directed back into the light guide 1212 by the TIR promoting layer. Such redirected light may then be reflected by the reflective bottom surface 1218 and directed through the output surface 1214 at substantially normal incidence to the output surface 1214. Some light within the light guide 1212 may be directed through the input surface 1216 toward the light source 1220. Such light may be collected by optical cavity 1270 and redirected into the light guide 1212 through the input surface 1216.

In general, the light source 1220 emits light having a first optical characteristic that is directed into the light guide 1212 by the optical cavity 1270. At least a portion of light is directed by the light guide 1212 and/or the reflective bottom surface 1218 of the light guide 1212 through the output surface 1214 such that it illuminates the first interference reflector 1230. The first interference reflector 1230 substantially transmits light having the first optical characteristic onto the emissive material 1240. When illuminated with light having the first optical characteristic, the emissive material 1240 emits light having a second optical characteristic. Some light may be emitted by the emissive material 1240 back toward the output surface 1214 of the light guide 1212. The first interference reflector 1230 may substantially reflect such light back away from the output surface 1214.

Figure 14:
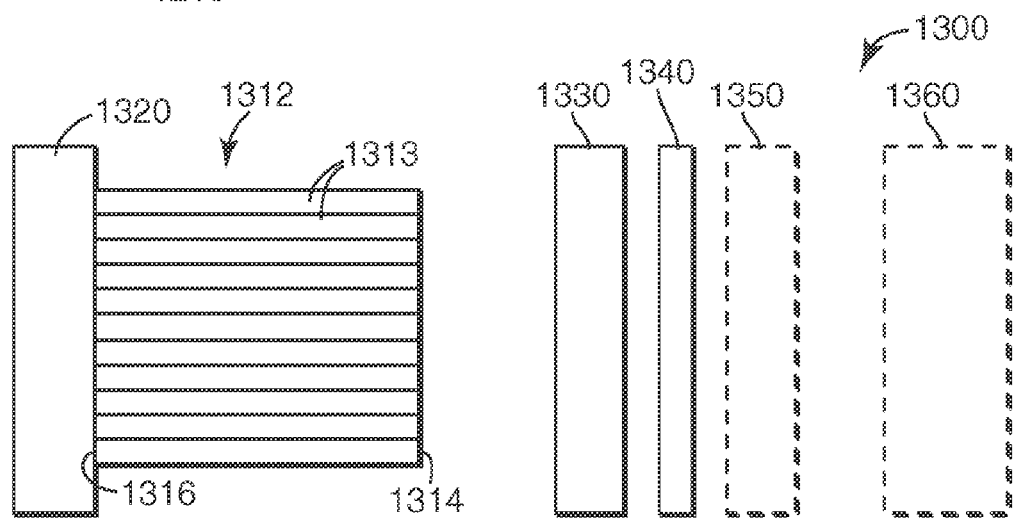
FIG. 14 is a schematic cross-section view of one embodiment of an illumination system having one or more light guides.

The illumination systems of the present disclosure may include any suitable type of light guide or guides. For example, FIG. 14 schematically illustrates one embodiment of an illumination system 1300 that includes light guides 1312 each having an input surface 1316 and an output surface 1314, and a light source 1320. The light guides 1312 are optically coupled to the light source 1320. The light source 1320 emits light having a first optical characteristic. The system further includes emissive material 1340 positioned to receive light from at least one light guide 1312, and a first interference reflector 1330 positioned between the emissive material 1340 and the output surfaces 1314 of the light guides 1312. The first interference reflector 1330 substantially transmits light having the first optical characteristic and substantially reflects light having a second optical characteristic. The emissive material 1340 emits light having the second optical characteristic when illuminated with light having the first optical characteristic. The system 1300 may also include an optional second interference reflector 1350 positioned such that the emissive material 1340 is between the second interference reflector 1350 and the first interference reflector 1330. All of the design considerations and possibilities in regard to the light guide 112, the light source 120, the first interference reflector 130, the emissive material 140, and the second interference reflector 150 of the embodiment illustrated in FIG. 2 apply equally to the light guides 1312, the light source 1320, the first interference reflector 1330, the emissive material 1340, and the optional second interference reflector 1350 of the embodiment illustrated in FIG. 14.

In some embodiments, the light guides 1312 may include one or more optical fibers 1313. The optical fibers 1313 may include any suitable type of optical fibers, e.g., large-core polymer clad silica fibers (such as those marketed under the trade designation TECS™, available from 3M Company, St. Paul, Minn.), glass fibers, plastic core optical fibers, etc.

The optical fibers 1313 are optically coupled to the light source 1320. As previously described herein, the light source 1320 may include any suitable type of light source or sources. In some embodiments, the light source 1320 may include discrete LED dies or chips disposed in an array pattern. Further, in some embodiments, the illumination system 1300 can include one optical fiber 1313 for each light source 1320.

Any suitable technique may be used to couple light emitted by the light source 1320 into the light guides 1312. For example, the illumination system 1300 may include one or more collectors that can convert isotropic emission from a corresponding LED die into a beam that will meet the acceptance angle criteria of a corresponding light-receiving light guide as described in the following co-owned patents and patent applications: U.S. Pat. No. 7,163,327 (Henson et al.); U.S. Patent Application Publication No. 2005/0117366 (Simbal); U.S. Patent Application No. 2005/0116635 (Watson et al.); U.S. Patent Application Publication No. 2005/0116235 (Schultz et al.); U.S. Patent Application No. 2005/0140270 (Henson et al.); U.S. Patent Application Publication No. 2005/0116176 (Aguirre et al.); and U.S. Patent Application Publication No. 2005/0134527 (Ouderkirk et al.).

The emissive material 1340 as well as the first interference reflector 1330 and/or second interference reflector 1350 may take any suitable shape as is further described herein. In some embodiments, the emissive material 1340 and one or both interference reflectors 1330 and 1350 may be in the form of a continuous layer or layers. In other embodiments, the emissive material 1340 and one or both of the interference reflectors 1330 and 1350 may be curved. Further, in some embodiments, the emissive material 1340 and one or both interference reflectors 1330 and 1350 may be non-continuous segments that are formed on and in contact with one or more output surfaces 1314 of the light guides 1312.

The emissive material 1340 may be positioned in any suitable relationship to the output surfaces 1314 of the light guides 1312. In some embodiments, the emissive material 1340 may be spaced apart from the output surfaces 1314. In other embodiments, the emissive material 1340 may be positioned on one or both of the first interference reflector 1330 and the optional second interference reflector 1350. In other embodiments, a TIR promoting layer or layers may be positioned on the emissive material 1340 between the emissive material 1340 and the first interference reflector 1330, between the emissive material 1340 and the optional second interference reflector 1350, or on both sides of the emissive material 1340 as is further described herein. See also U.S. Pat. No. 7,157,839 (Ouderkirk et al.).

The first interference reflector 1330 may be positioned in any suitable location relative to the output surfaces 1314 and the emissive material 1340, e.g., spaced apart from the output surfaces 1314, spaced apart from the emissive material 1340, on the output surfaces 1314, on the emissive material 1340, on both the output surfaces 1314 and the emissive material 1340, etc. In some embodiments, a TIR promoting layer or layers may be included between the output ends 1314 and the first interference reflector 1330. Further, in some embodiments, the output surfaces 1314 of the light guides 1312 and the first interference reflector 1330 may be index-matched using any suitable technique or materials, e.g., using index matching fluids, gels., adhesives, pressure sensitive adhesives, UV cured adhesives, or cements.

The illumination system 1300 may also include one or more optical elements 1360. The one or more optical elements 1360 may be positioned to receive light from the emissive material 1340, between the emissive material 1340 and the first interference reflector 1330, and/or between the output surfaces 1314 of the light guides 1312 and the first interference reflector 1330. The one or more optical elements 1360 may include collimating optics for directing light within a predetermined angle toward a display or other device. For example, the one or more optical elements 1360 may include brightness enhancement films, turning films, lenses, diffusers, gain diffusers, contrast-enhancing materials, reflective elements, etc. In some embodiments, the one or more optical elements 1360 may include a walk-off plate or crystal to provide a more uniform light distribution. Walk-off plates or crystals include layers that separate a ray of light into two rays that are displaced from each other, where such displacement results from the two polarization states of a light ray that each encounter different degree of refraction when impinging upon the walk-off crystal. Typical walk-off plates are made from a material that has different refractive indices for different polarizations of light (i.e., birefringence). Typically, the high refractive index direction is skewed from at least one of the in-plane axes of the plate.

In some embodiments, the one or more optical elements 1360 may include a reflective polarizer that allows light of a preferred polarization to be emitted by the system 1300, while reflecting the other polarization. Any suitable reflective polarizer may be utilized, e.g., cholesteric reflective polarizers, cholesteric reflective polarizers with a ¼ wave retarder, wire grid polarizers, and a variety of reflective polarizers available from 3M Company, including DBEF (i.e., a specularly reflective polarizer), DRPF (i.e., a diffusely reflective polarizer). Light reflected by the reflective polarizer 1360 can be depolarized by the emissive material 1340, and/or the interference reflectors 1330 and 1350 and recycled such that light of the selected polarization can be emitted with greater efficiency.

In general, light from the light source 1320 illuminates the input surfaces 1316 of the light guides 1312 and is directed by the light guides 1312 through the output surfaces 1314 where at least a portion of such light illuminates the first interference reflector 1330. The first interference reflector 1330 substantially transmits the light from the light source 1320 such that at least a portion of the light illuminates the emissive material 1340.

The emissive material 1340 emits light having the second optical characteristic when illuminated with light having the first optical characteristic. For example, the emissive material 1340 may be selected such that it emits visible light when illuminated with UV or blue light from the light source 1320. At least a portion of the light emitted by the emissive material 1340 illuminates the optional second interference reflector 1350, which substantially transmits such light. Any light from the light source 1320 that is not converted by the emissive material 1340 is substantially reflected by the optional second interference reflector 1350 back toward the emissive material 1340. Further, any light emitted by the emissive material 1340 that illuminates the first interference reflector 1330 is substantially reflected.

Figure 15:
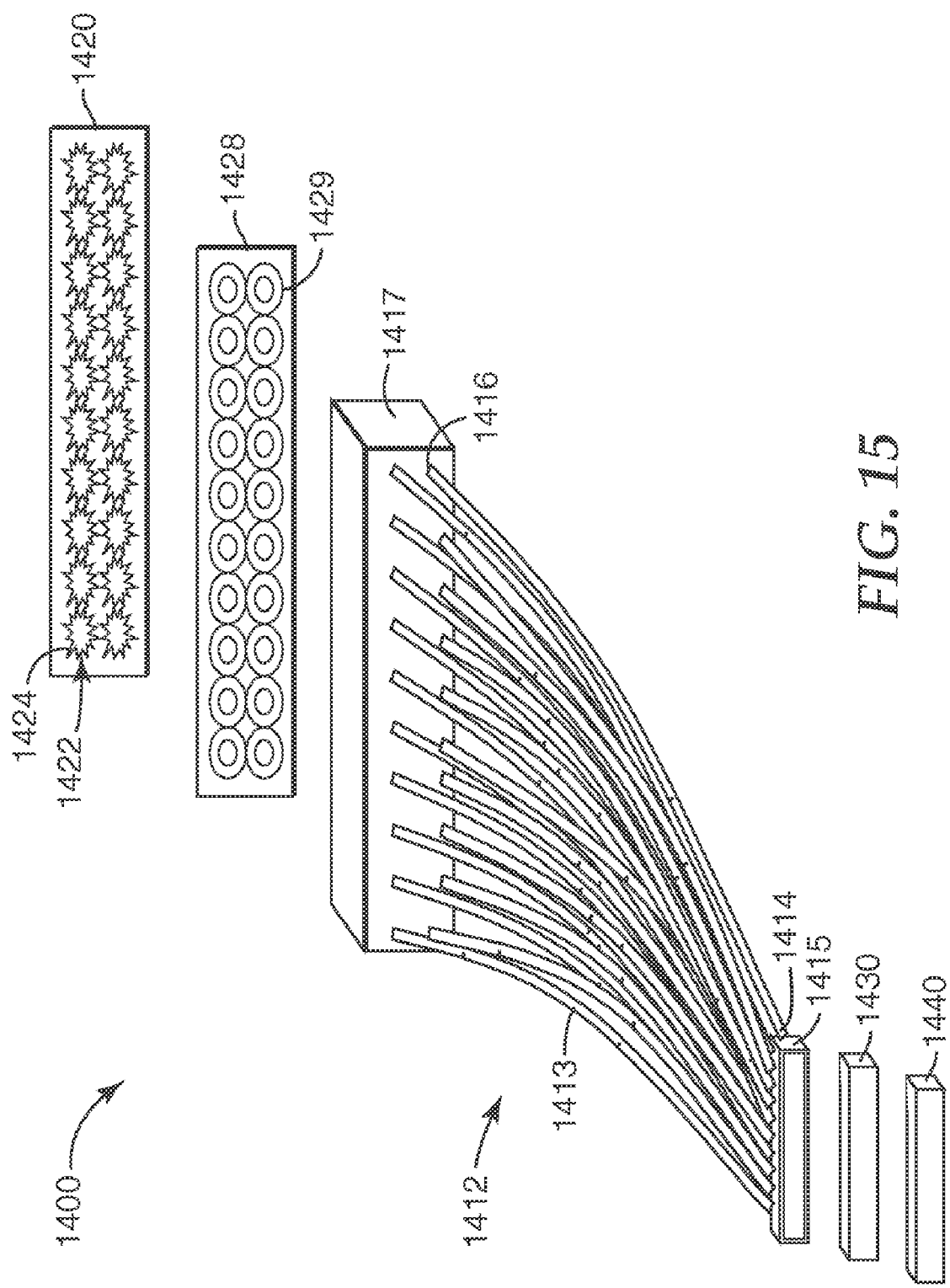
FIG. 15 schematically illustrates another embodiment of an illumination system having one or more light guides.

As previously mentioned herein, any suitable technique may be used to couple light from the light source 1320 into the light guides 1312. For example, FIG. 15 schematically illustrates another embodiment of an illumination system 1400 that includes light guides 1412 including optical fibers 1413. See, e.g., co-owned and copending U.S. Pat. No. 7,163,327 (Henson et al.). The system 1400 includes a light source 1420, emissive material 1440 positioned to receive light from the light source 1420, and a first interference reflector 1430 positioned between the light guides 1412 and the emissive material 1440. All of the design considerations and possibilities in regard to the light guide 1312, the light source 1320, the first interference reflector 1330, and the emissive material 1340 of the embodiment illustrated in FIG. 14 apply equally to the light guide 1412, the light source 1420, the first interference reflector 1430, and the emissive material 1440 of the embodiment illustrated in FIG. 15. The system 1400 may also include a second interference reflector (not shown) as is further described herein.

Light source 1420 includes an array 1422 of LED dies 1424 that are positioned in optical alignment with an array of optical elements 1428, which can include passive optical elements, such as focusing lenses 1429 or optical concentrating elements, such as reflectors. The array of optical elements 1428 are in turn optically aligned to an array of optical fibers 1413. The array of optical fibers 1413 can be connectorized, where the connectorization can include a connector 1417 to support and/or house input surfaces 1416 of fibers 1413. The connectorization can also include a connector 1415 to support and/or house output surfaces 1414 of fibers 1413. Any suitable connector or connectors may be used at either the input surfaces 1416 or output surfaces 1414 of the optical fibers 1413, e.g., those described in U.S. patent Ser. No. 10/726,222 (Henson et al.). As would be apparent to one of ordinary skill in the art given the present description, the output surfaces 1414 of the fibers 1413 may be bundled to form a point-like source or a shaped-array, such as a linear array, circular array, hexagonal array, or other shaped-array.

In an exemplary embodiment, the array 1422 of light source 1420 includes an array of discrete LEDs 1424, such as an array of single LED dies or chips, which are mounted individually and have independent electrical connections for operational control (rather than an LED array where all the LEDs are connected to each other by their common semiconductor substrate). LED dies can produce a symmetrical radiation pattern, making them desirable light sources for the present disclosure. LED dies are efficient at converting electrical energy to light and are not as temperature sensitive as most laser diodes. Therefore, LED dies may operate adequately with only a modest heat sink compared to many types of laser diodes. In an exemplary embodiment, each LED die 1424 is spaced apart from its nearest neighbor(s) by at least a distance greater than an LED die width.

In addition, LED dies can be operated at a temperature from −40° to 125° C. and can have operating lifetimes in the range of 100,000 hours, as compared to most laser diode lifetimes around 10,000 hours or halogen automobile headlamp lifetimes of 500-1000 hours. In an exemplary embodiment, the LED dies 1424 can each have an output intensity of about 50 Lumens or more. Discrete high-power LED dies are commercially available from companies such as Cree and Osram. In one exemplary embodiment, an array of LED dies 1424 (manufactured by Cree), each having an emitting area of about 300 μm×300 μm, can be used to provide a concentrated (small area, high power) light source. Other light emitting surface shapes such as rectangular or other polygonal shapes can also be utilized. In addition, in alternative embodiments, the emission layer of the LED dies 1424 utilized can be located on the top or bottom surface.

In an alternative embodiment, the array 1422 may be replaced with a white vertical cavity surface emitting laser (VCSEL) array. The passive optical element array 1428 may be used to redirect that light emitted from each VCSEL into a corresponding fiber 1413.

An aspect of the illustrated embodiment of FIG. 15 is the one-to-one correspondence between each light source 1412, a corresponding passive optical element of the array of optical elements 1428 (lens, focusing, concentrating, or reflective element), and a corresponding optical fiber 1413. When powered, each LED die 1424 acts as an individual light source that launches light into a corresponding fiber 1413. The present exemplary embodiment includes large-core (for example, 400 μm to 1000 μm) polymer clad silica fibers (such as those marketed under the trade designation TECS™, available from 3M Company, St. Paul, Minn.). Other types of optical fibers, such as conventional or specialized glass fibers may also be utilized in accordance with the embodiments of the present disclosure, depending on such parameters, e.g., as the output wavelength(s) of the LED dies 1424.

In addition, as would be apparent to one of ordinary skill given the present description, other waveguide types, such as planar waveguides, polymer waveguides, or the like, may also be utilized in accordance with the present teachings.

Optical fibers 1413 may further include fiber lenses on each of the output surfaces 1414 of the optical fibers 1413. Similarly, the input surfaces 1416 of the optical fibers 1413 may each further include a fiber lens. Fiber lens manufacture and implementation is described in co-owned U.S. Pat. No. 6,822,190 (Smithson et al.) and U.S. Patent Application Publication 2005/0069256 (Jennings et al.).

The individual optical fibers 1413 are collected together to provide remote lighting at a distance from the original light sources. A further description of an LED-based lighting assembly that is implanted as a bulb replacement is described in co-owned and copending U.S. Patent Application Publication No. 2005/0140270 (Henson et al.).

In some embodiments, the LED dies 1424 may be independently controllable such that one or more LEDs 1424 can be selectively activated. For example, the system 1400 may include a controller (not shown) that is in electrical communication with each LED 1424. The controller is operable to selectively activate one or more LEDs 1424. Any suitable controller or controllers may be used, e.g., those described in co-owned U.S. Pat. No. 7,163,327 (Henson et al.). Such controllable output of the LEDs 1424 may be used in various types of applications, e.g., steerable headlamps for motor vehicles, pixilated displays, projection systems, signs, etc.

In general, light having a first optical characteristic is emitted by one or more LEDs 1424 of the light source 1420, such light is directed into one or more optical fibers 1413 through their input surfaces 1416 by optical elements 1428. The light is directed by the optical fibers 1413 through their output surfaces 1414 and illuminates the first interference reflector 1430. The first interference reflector 1430 substantially transmits the light such that it illuminates emissive material 1440. The emissive material 1440 converts at least a portion of the light from the light source 1420 into light having a second optical characteristic. Light emitted by the emissive material 1440 that is directed toward the first interference reflector 1430 is substantially reflected by the first interference reflector 1430. If a LP interference reflector (e.g., second interference reflector 150 of FIG. 2) is included in system 1400, then the light emitted by the emissive material 1440 is substantially transmitted by the LP interference reflector. Any light from the light source 1420 that illuminates the LP interference reflector is substantially reflected back toward the emissive material 1440 where it may then be converted into light having the second optical characteristic. Light emitted by the emissive material 1440 and/or transmitted by the optional LP interference reflector can then be directed to a desired location using any suitable technique.

Figure 18:
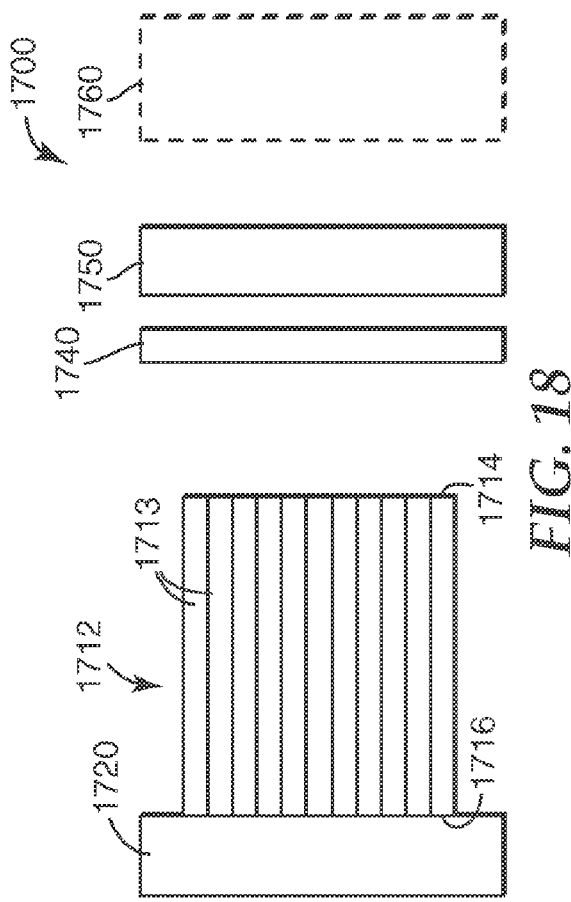
FIG. 18 is a schematic cross-section view of another embodiment of an illumination system having one or more light guides.

In some embodiments, the illumination systems 1300 of FIG. 14 and 1400 of FIG. 15 may include a LP interference reflector and no SP interference reflector. For example, FIG. 18 schematically illustrates an illumination system 1700 that includes an interference reflector 1750 positioned to receive light from emissive material 1740. The system 1700 also includes a light source 1720, and light guides 1712 optically coupled to the light source 1720. All of the design considerations and possibilities in regard to the light guides 1312, the light source 1320, the emissive material 1340, and the optional second interference reflector 1350 of the embodiment illustrated in FIG. 14 apply equally to the light guides 1712, the light source 1720, the emissive material 1740, and the interference reflector 1750 of the embodiment illustrated in FIG. 18. The system 1700 may include other features similar to those described in respect to illumination system 1300 of FIG. 14, e.g., one or more optical elements, TIR promoting layers, etc.

In general, the light source 1720 emits light having a first optical characteristic. Such light illuminates input surfaces 1316 of light guides 1312 and is directed by the light guides 1712 through the output surfaces 1714 where at least a portion of such light illuminates the emissive material 1740. The emissive material 1740 emits light having a second optical characteristic when illuminated with light having the first optical characteristic. At least a portion of the light emitted by the emissive material 1740 illuminates the interference reflector 1740, which substantially transmits light having the second optical characteristic and substantially reflects light having the first optical characteristic. The substantially transmitted light is then directed to a desired location using any suitable technique.

Figure 16:
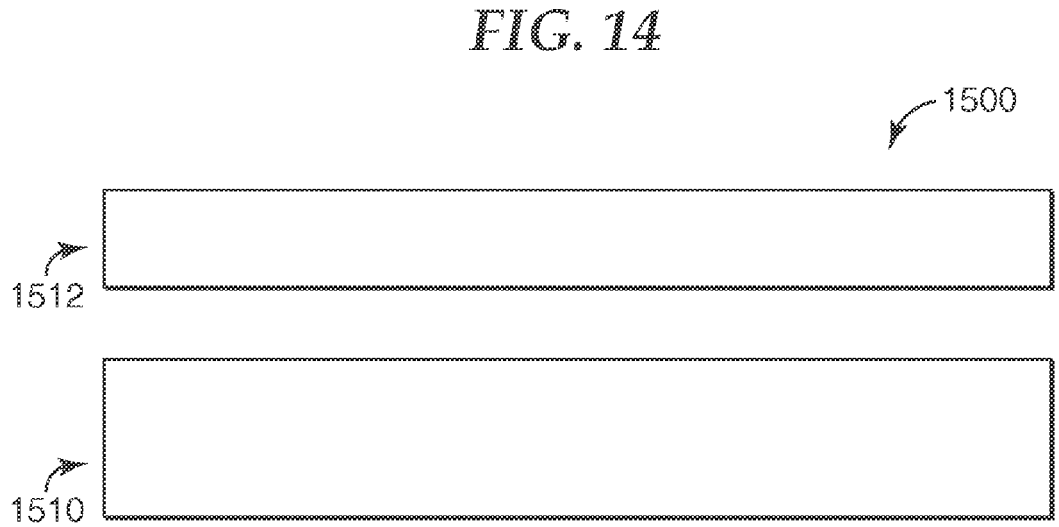
FIG. 16 schematically illustrates a display assembly including an illumination system and a display device.

The illumination systems of the present disclosure may be used in any suitable manner for providing illumination. For example, some or all of the illumination systems described herein may be used to provide illumination for displays. FIG. 16 schematically illustrates a display assembly 1500 that includes an illumination system 1510 optically coupled to a display device 1512. The illumination system 1510 may include any illumination system described herein, e.g., illumination system 10 of FIG. 1. The illumination system 1510 provides illumination light to the display device 1512. The display device 1512 may be any suitable display device, e.g., LCD, electrochromatic or electrophoretic devices, spatial light modulator(s), transmissive signs, etc.

For example, the display device 1512 may include one or more spatial light modulators. In some embodiments, the one or more spatial light modulators may include an array of individually addressable controllable elements. Such spatial light modulators may include a suitable type of controllable element. For example, the spatial light modulator may include a variable-transmissivity type of display. In some embodiments, the spatial light modulator may include a liquid crystal display (LCD), which is an example of a transmission-type light modulator. In some embodiments, the spatial light modulator may include a deformable mirror device (DMD), which is an example of a reflection-type light modulator.

The display device 1512 may include any suitable optical and non-optical elements for producing a display image, e.g., lenses, diffusers, polarizers, filters, beam splitters, brightness enhancement films, etc. The illumination system 1510 may be optically coupled to the display device 1312 using any suitable technique known in the art.

All references and publications cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An illumination system, comprising:
   a light source that emits light comprising a first optical characteristic;
   a light guide comprising an output surface;
   an interference reflector positioned between the light source and the output surface of the light guide, wherein the interference reflector substantially transmits light comprising a second optical characteristic and substantially reflects light comprising the first optical characteristic; and
   emissive material positioned between the light source and the interference reflector, wherein the emissive material emits light comprising the second optical characteristic when illuminated light comprising the first optical characteristic; and
   an optical cavity optically coupled to the light source, wherein the optical cavity is configured to direct light comprising at least one of the first optical characteristic and second optical characteristic toward an input surface of the light guide.

2. The system of claim 1, wherein the first optical characteristic comprises a first wavelength region and the second optical characteristic comprises a second wavelength region different than the first wavelength region.

3. The system of claim 2, wherein the first wavelength region comprises UV light.

4. The system of claim 2, wherein the first wavelength region comprises blue light.

5. The system of claim 1, wherein the emissive material is discontinuous.

6. The system of claim 5, wherein the discontinuous emissive material comprises a plurality of dots of emissive material.

7. The system of claim 6, wherein each dot of the plurality of dots of emissive material has an area of less than 10000 $\mu m^2$.

8. The system of claim 6, wherein at least one dot of the plurality of dots of emissive material comprises a first emissive material and at least one other dot of the plurality of dots of emissive material comprises a second emissive material.

9. The system of claim 6, wherein the first optical characteristic comprises a first wavelength region and the second optical characteristic comprises a second wavelength region different than the first wavelength region, wherein at least a first phosphor dot emits light having a first peak wavelength within the second wavelength region and at least a second phosphor dot emits light having a second peak wavelength within the second wavelength region different than the first peak wavelength.

10. The system of claim 1, wherein the first optical characteristic comprises a first wavelength region and the second optical characteristic comprises a second wavelength region different than the first wavelength region, wherein the emissive material comprises a first index of refraction at the first wavelength region.

11. The system of claim 10, wherein the system further comprises a TIR promoting layer in contact with the emissive material between the interference reflector and the emissive material, and further wherein the TIR promoting layer comprises a second index of refraction at the first wavelength region that is less than the first index of refraction.

12. The system of claim 1, further comprising at least one optical element positioned such that the interference reflector is between the emissive material and the at least one optical element.

13. The system of claim 12, wherein the at least one optical element comprises a reflective polarizer.

14. A display, comprising:
   an illumination system, wherein the illumination system comprises:
      a light source that emits light comprising a first optical characteristic;

a light guide comprising an output surface, wherein the light guide is configured to direct at least a portion of the light emitted by the light source through the output surface;

an interference reflector positioned between the light source and the output surface of the light guide, wherein the interference reflector substantially transmits light comprising a second optical characteristic and substantially reflects light comprising the first optical characteristic; and emissive material positioned between the light source and the interference reflector, wherein the emissive material emits light comprising the second optical characteristic when illuminated light comprising the first optical characteristic; and a spatial light modulator optically coupled to the illumination system, wherein the spatial light modulator comprises a plurality of controllable elements operable to modulate at least a portion of light from the illumination system.

15. The display of claim 14, wherein the plurality of controllable elements of the spatial light modulator comprises variable-transmissivity display elements.

16. The display of claim 14, wherein the first optical characteristic comprises a first wavelength region and the second optical characteristic comprises a second wavelength region different than the first wavelength region.

17. The display of claim 16, wherein the first wavelength region comprises UV light.

18. The display of claim 16, wherein the first wavelength region comprises blue light.

19. The display of claim 14, further comprising at least one optical element positioned such that the interference reflector is between the emissive material and the at least one optical element.

20. The display of claim 19, wherein the at least one optical element comprises a reflective polarizer.

* * * * *

UNITED STATES PATENT AND TRADEMARK OFFICE
CERTIFICATE OF CORRECTION

PATENT NO. : 7,497,608 B2 Page 1 of 1
APPLICATION NO. : 11/838524
DATED : March 3, 2009
INVENTOR(S) : A. Wheatley It is certified that error appears in the above-identified patent and that said Letters Patent is hereby corrected as shown below:

Column 3,
Line 46, Delete "9(a)." and insert -- 9(A). --, therefor.
Line 51, Delete "10(a)" and insert -- 10(A) --, therefor.

Column 9,
Line 29-30, Delete "polynorborene" and insert -- polynorbornene --, therefor.
Line 30-31, Delete "sterioisomers" and insert -- stereoisomers --, therefor.

Column 16,
Line 50, Delete "polynorborene" and insert -- polynorbornene --, therefor.
Line 51, Delete "sterioisomers" and insert -- stereoisomers --, therefor.

Column 29,
Line 52, Delete "gels.," and insert -- gels, --, therefor.

Column 32,
Line 28, Delete "pixilated" and insert -- pixelated --, therefor.

Column 34,
Line 8, After "illuminated" insert -- with --, therefor.

Signed and Sealed this

Sixteenth Day of March, 2010

David J. Kappos
*Director of the United States Patent and Trademark Office*